US008821742B2

(12) United States Patent
Yoshida et al.

(10) Patent No.: US 8,821,742 B2
(45) Date of Patent: Sep. 2, 2014

(54) PLASMA ETCHING METHOD

(75) Inventors: Ryoichi Yoshida, Nirasaki (JP); Tetsuo Yoshida, Nirasaki (JP); Michishige Saito, Nirasaki (JP); Toshikatsu Wakaki, Nirasaki (JP); Hayato Aoyama, Nirasaki (JP); Akira Obi, Nirasaki (JP); Hiroshi Suzuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 422 days.

(21) Appl. No.: 12/700,571

(22) Filed: Feb. 4, 2010

(65) Prior Publication Data
US 2010/0133234 A1 Jun. 3, 2010

Related U.S. Application Data

(63) Continuation of application No. 11/192,029, filed on Jul. 29, 2005, now abandoned.

(60) Provisional application No. 60/603,547, filed on Aug. 24, 2004, provisional application No. 60/635,488, filed on Dec. 14, 2004.

(30) Foreign Application Priority Data

Jul. 30, 2004 (JP) .................................. 2004-224274
Dec. 2, 2004 (JP) .................................. 2004-349608

(51) Int. Cl.
H01L 21/306 (2006.01)
C03C 15/00 (2006.01)
H01J 37/32 (2006.01)
H01L 21/311 (2006.01)

(52) U.S. Cl.
CPC ....... *H01J 37/32449* (2013.01); *H01J 37/3244* (2013.01); *H01L 21/31116* (2013.01); *H01J 37/32091* (2013.01)
USPC ...................................... 216/67; 156/345.34

(58) Field of Classification Search
USPC ....................................... 156/345.34; 216/67
See application file for complete search history.

(56) References Cited

U.S. PATENT DOCUMENTS 5,496,408 A   3/1996 Motoda et al.
5,525,159 A   6/1996 Hama et al.
(Continued)

FOREIGN PATENT DOCUMENTS

JP   6-77177    3/1994
JP   9-22797    1/1997
JP   11-16888   1/1999

OTHER PUBLICATIONS

JP 11-016888, Katsuhiko, Jan. 22, 1999 (Machine Translation).*

*Primary Examiner* — Parviz Hassanzadeh
*Assistant Examiner* — Nathan K Ford
(74) *Attorney, Agent, or Firm* — Rothwell, Figg, Ernst & Manbeck, P.C.

(57) ABSTRACT

A plasma etching method by using a plasma etching apparatus having a depressurizable processing chamber; a lower electrode for mounting thereon a substrate to be processed in the processing chamber; an upper electrode facing the lower electrode in the processing chamber with a plasma generation region formed therebetween; a radio frequency power supply unit for applying a radio frequency power between the upper electrode and the lower electrode to thereby form a radio frequency electric field in the plasma generation region, the method comprising: supplying a first gas including etchant gas to an upper gas inlet to introduce the first gas through the upper electrode into the plasma generation region; and feeding a second gas including dilution gas to a side gas inlet to introduce the second gas through a sidewall of the processing chamber into the plasma generation region.

11 Claims, 18 Drawing Sheets

(56) References Cited

U.S. PATENT DOCUMENTS

| | | | |
|---|---|---|---|
| 5,540,782 A | 7/1996 | Miyagi et al. | |
| 5,906,683 A * | 5/1999 | Chen et al. | 118/724 |
| 2002/0011210 A1 | 1/2002 | Satoh et al. | |
| 2003/0000924 A1 * | 1/2003 | Strang | 216/86 |
| 2003/0056900 A1 | 3/2003 | Li et al. | |
| 2003/0127498 A1 | 7/2003 | Abe | |
| 2003/0203626 A1 * | 10/2003 | Derderian et al. | 438/689 |
| 2004/0103844 A1 | 6/2004 | Chou et al. | |
| 2004/0112539 A1 * | 6/2004 | Larson et al. | 156/345.33 |
| 2005/0133160 A1 * | 6/2005 | Kennedy et al. | 156/345.34 |

* cited by examiner

PLASMA ETCHING METHOD

CROSS-REFERENCE TO RELATED APPLICATIONS

This application is a Continuation application of U.S. patent application Ser. No. 11/192,029, filed Jul. 29, 2005, now abandoned, which claims priority to U.S. Provisional applications Ser. No. 60/603,547, filed Aug. 24, 2004, and Ser. No. 60/635,388, filed Dec. 14, 2004, and Japanese patent applications No. 2004-224274, filed Jul. 30, 2004, and No. 2004-349608, filed Dec. 2, 2004. The entire contents of U.S. patent application Ser. No. 11/192,029 are herein incorporated by reference.

FIELD OF THE INVENTION

The present invention relates to a plasma etching apparatus; and, more particularly, to a parallel plate plasma etching apparatus.

BACKGROUND OF THE INVENTION

A recent trend towards a miniaturized semiconductor device structure in design criteria intensifies a demand for processing a material to be etched in a cross sectional shape of a high-density pattern. Currently, in a plasma etching apparatus for use in manufacturing a semiconductor device or a flat panel display (FPD), a generation of high-density plasma is indispensable for a miniaturization of a semiconductor device structure or a high-rate etching process for a substrate to be processed (a semiconductor wafer, a glass substrate or the like). Accordingly, in a parallel plate plasma etching apparatus, in order to generate the high-density plasma, various investigations or trials have been attempted by way of increasing a frequency of a plasma exciting radio frequency RF from a conventional standard frequency of 13.56 MHz to a remarkably high frequency (e.g., 40 MHz or higher).

Along with the high density of the plasma, a demand for uniformity of etching characteristics (especially, an etching rate, an etching pattern or the like) on a substrate becomes more and more strict. Conventionally, in the parallel plate plasma etching apparatus, an upper electrode serves as a shower head having a plurality of gas injection openings, and an etching gas is discharged through the shower head toward a substrate on a lower electrode. Further, a glow discharge occurs between the electrodes due to a radio frequency power applied thereto, thereby generating a plasma of the etching gas. As for the etching gas, there has been widely used a mixed gas wherein an etchant gas containing halogen atoms such as chlorine or fluorine is mixed with an inert gas, e.g., Ar, and/or an additive gas, e.g., $O_2$.

However, in the conventional parallel plate plasma etching apparatus, it is difficult to realize uniform etching characteristics on a substrate to be processed and, further, it is hard to control etching characteristics, especially on a peripheral portion of the substrate. According to the finding of the inventors of the present invention, even if a flow rate of an etching gas to be introduced into a processing chamber or a pressure in the chamber is adjusted to be set at predetermined specific values, it is difficult to precisely control a flow or a density distribution of the etching gas in a space above a substrate, i.e., in a plasma generation region, and especially those in a vicinity of the peripheral portion of the substrate are likely to be nonuniform and incontrollable.

SUMMARY OF THE INVENTION

It is, therefore, an object of the present invention to provide a parallel plate plasma etching apparatus capable of improving a controllability of etching characteristics by way of precisely and freely controlling a flow or a density distribution of a processing gas introduced into a processing chamber.

In accordance with an aspect of the present invention, there is provided a first plasma etching apparatus including: a depressurizable processing chamber; a lower electrode for mounting thereon a substrate to be processed in the processing chamber; an upper electrode facing the lower electrode in the processing chamber with a plasma generation region formed therebetween; a radio frequency power supply unit for applying a radio frequency between the upper electrode and the lower electrode to thereby form a radio frequency electric field in the plasma generation region; an upper gas inlet for introducing a first gas including etchant gas through the upper electrode into the plasma generation region; and a side gas inlet for introducing a second gas including dilution gas through a sidewall of the processing chamber into the plasma generation region.

In the first plasma etching apparatus, the first gas including etchant gas is introduced downward through the upper gas inlet into the plasma generation region between the upper electrode and the lower electrode and, at the same time, the second gas including dilution gas is introduced inwardly through the side gas inlet into the plasma generation region. In accordance with such gas introduction manner for introducing and mixing different etching gas species from two directions of the upper and the side portion, gas species, gas mixing ratios and gas flow rates of each system can be properly selected and adjusted and, further, a balance between both systems can be controlled. Accordingly, it is possible to precisely and freely control a flow or a density distribution of a processing gas in the plasma generation region, thereby improving a controllability of etching characteristics on a substrate.

Preferably, the upper gas inlet has a first mass flow control unit for independently controlling a flow rate of the first gas. Further, in case the first gas is a mixed gas, it is preferable to provide at the upper gas inlet a first mixing ratio control unit for independently controlling a mixing ratio of the first gas.

Preferably, the upper gas inlet has an upper gas injection portion provided at the upper electrode, for injecting the first gas toward the plasma generation region. The upper gas injection portion preferably has a plurality of gas injection openings disposed at regular intervals. Further, the upper gas inlet has a first gas supply line for supplying the first gas toward the upper gas injection portion and an upper buffer space for accumulating the first gas supplied through the first gas supply line in front of the upper gas injection portion.

Preferably, the side gas inlet has a second mass flow control unit for independently controlling a flow rate of the second gas. In case the second gas is a mixed gas, it is preferable to provide at the side gas inlet a second mixing ratio control unit for independently controlling a mixing ratio of the second gas.

Preferably, the side gas inlet has a side gas injection portion provided at the sidewall of the processing chamber, for injecting the second gas toward the plasma generation region. The side gas injection portion preferably has a plurality of gas injection openings disposed at regular intervals. Further, the side gas inlet has a second gas supply line for supplying the second gas toward the side gas injection portion and a side gas buffer space for accumulating the second gas supplied through the second gas supply line in front of the upper gas injection portions. The side gas injection portion is preferably made of a material without causing any contamination problem, e.g., Si and SiC, or a heat-resistance material such as quartz.

A gas to be added to the etchant gas can be introduced through the upper gas inlet and the side gas inlet while being distributed at an arbitrary ratio. Generally, it is preferable to introduce all or most of the additive gas through the upper gas inlet or the side gas inlet.

In accordance with another aspect of the present invention, there is provided a second plasma etching apparatus including: a depressurizable processing chamber; a lower electrode for mounting thereon a substrate to be processed in the processing chamber; an upper electrode facing the lower electrode in the processing chamber with a plasma generation region formed therebetween; a radio frequency power supply unit for applying a radio frequency between the upper electrode and the lower electrode to thereby form a radio frequency electric field in the plasma generation region; an upper central gas inlet for introducing a first gas including dilution gas through a central portion of the upper electrode into the plasma generation region; an upper peripheral gas inlet for introducing a second gas including etchant gas through a peripheral portion provided at an outside of the central portion of the upper electrode along its radial direction into the plasma generation region; and a side gas inlet for introducing a third gas including dilution gas through a sidewall of the processing chamber into the plasma generation region.

In the second plasma etching apparatus, the first gas including dilution gas is introduced downward through the upper central gas inlet into the plasma generation region between the upper electrode and the lower electrode; the second gas including etchant gas is introduced downward through the upper peripheral gas inlet into the plasma generation region; and the third gas including dilution gas is introduced inwardly (toward the center) through the side gas inlet. In accordance with such gas introduction manner for introducing two gas species for etching from two directions, i.e., from above and side and mixing the first and the third gas including dilution gas respectively through the upper central gas inlet and the side gas inlet so that the second gas including etchant gas introduced through the upper peripheral gas inlet can be maintained between the central portion and the side portion, it is possible to precisely and freely control a flow or a density distribution of a processing gas in the plasma generation region. Accordingly, a controllability of etching characteristics on a substrate can be further enhanced.

Preferably, the upper central gas inlet has a first mass flow control unit for independently controlling a flow rate of the first gas. In case the first gas is a mixed gas, it is preferable to provide in the upper central gas inlet a first mixing ratio control unit for independently controlling a mixing ratio of the first gas. Further, preferably, the upper central gas inlet has upper central gas injection portions provided at a central portion of the upper electrode, for injecting the first gas toward the plasma generation region. The upper central gas injection portions preferably have a plurality of gas injection openings disposed at regular intervals. Further, the upper central gas inlet preferably has a first gas supply line for supplying the first gas toward the upper central gas injection portions and an upper central gas buffer space for accumulating the first gas supplied through the first gas supply line in front of the upper central gas injection portions.

Preferably, the upper peripheral gas inlet has a second mass flow control unit for independently controlling a flow rate of the second gas. In case the second gas is a mixed gas, the upper peripheral gas inlet preferably has a second mixing ratio control unit for independently controlling a mixing ratio of the second gas. Further, preferably, the upper peripheral gas inlet has an upper peripheral gas injection portion provided at an outside of the central portion of the upper electrode along its radial direction, for injecting the second gas toward the plasma generation region. The upper peripheral gas injection portion preferably has a plurality of gas injection openings disposed at regular intervals. Further, the upper peripheral gas inlet preferably has a second gas supply line for supplying the second gas toward the upper peripheral gas injection portion and an upper peripheral gas buffer space for accumulating the second gas supplied through the second gas supply line in front of the upper peripheral gas injection portion.

Preferably, the side gas inlet has a third mass flow control unit for independently controlling a flow rate of the third gas. In case the third gas is a mixed gas, the side gas inlet preferably has a third mixing ratio control unit for independently controlling a mixing ratio of the third gas. Further, preferably, the side gas inlet has side gas injection portions provided on a sidewall of the processing chamber, for injecting the third gas toward the plasma generation region. The side gas injection portion preferably has a plurality of gas injection openings disposed at regular intervals and preferably are circumferentially provided on the sidewall of the processing chamber at regular intervals. Furthermore, the side gas inlet preferably has a third gas supply line for supplying the third gas toward the side gas injection portion and a side buffer space for accumulating the third gas supplied through the third gas supply line in front of the side gas injection portion. The side gas inlet is preferably made of a material without causing any contamination problem, e.g., Si and SiC, or a heat-resistance material such as quartz.

A gas to be added to the etchant gas can be introduced through the upper central gas inlet, the upper peripheral gas inlet and the side gas inlet while being distributed at an arbitrary ratio. Generally, it is preferable to introduce all or most of the additive gas through the upper central gas inlet or the upper peripheral gas inlet and the side gas inlet.

In accordance with still another aspect of the present invention, there is provided a third plasma etching apparatus including: a depressurizable processing chamber; a lower electrode for mounting thereon a substrate to be processed in the processing chamber; an upper electrode facing the lower electrode in the processing chamber with a plasma generation region formed therebetween; a radio frequency power supply unit for applying a radio frequency between the upper electrode and the lower electrode to thereby form a radio frequency electric field in the plasma generation region; a first gas inlet for introducing a first gas including dilution gas through a first region containing a central portion of the upper electrode into the plasma generation region; a second gas inlet for introducing a second gas including etchant gas through a second region of the upper electrode provided at an outside of the first region along its radial direction into the plasma generation region; and a third gas inlet for introducing a third gas including dilution gas through a third region of the upper electrode provided at an outside of the second region along its radial direction into the plasma generation region.

In the third plasma etching apparatus, the first gas including dilution gas is introduced downward through the first upper gas inlet into the plasma generation region between the upper electrode and the lower electrode; the second gas including etchant gas is introduced downward through the second upper gas inlet into the plasma generation region; and the third gas including dilution gas is introduced downward through the third gas inlet into the plasma generation region. In accordance with such gas introduction manner for introducing and mixing the first and the third gas including dilution gas respectively through the first and the third upper gas inlet so that the second gas including etchant gas introduced through the second upper gas inlet located at a middle portion of the upper electrode in a diametric direction, can be maintained between the central portion and the peripheral portion, it is possible to precisely and freely control a flow or a density distribution of a processing gas in the plasma generation region. Accordingly, a controllability of etching characteristics on a substrate can be further improved.

Preferably, the first upper gas inlet has a first mass flow control unit for independently controlling a flow rate of the first gas. In case the first gas is a mixed gas, the first upper gas inlet preferably has a first mixing ratio control unit for independently controlling a mixing ratio of the first gas. Further, Preferably, the first upper gas inlet has a first upper gas injection portion provided in the first region of the upper electrode, for injecting the first gas toward the plasma generation region. The first upper gas injection portion preferably has a plurality of gas injection openings disposed at predetermined specific intervals. Further, the first upper gas inlet preferably has a first gas supply line for supplying the first gas toward the first upper gas injection portion and a first upper gas buffer space for accumulating the first gas supplied through the first upper gas supply line in front of the first upper gas injection portion.

Preferably, the second upper gas inlet has a second mass flow control unit for independently controlling a flow rate of the second gas. In case the second gas is a mixed gas, the second upper gas inlet preferably has a second mixing ratio control unit for independently controlling a mixing ratio of the second gas. Further, preferably, the second upper gas inlet has a second upper gas injection portion provided in the second region of the upper electrode, for injecting the second gas toward the plasma generation region. It is preferable that the second upper gas injection portion has a plurality of gas injection openings disposed at predetermined specific intervals. Further, the second upper gas inlet preferably has a second gas supply line for supplying the second gas toward the second upper gas injection portion and a second upper buffer space for accumulating the second gas supplied from the second gas supply line in front of the second upper gas injection portion.

In accordance with a preferred embodiment of the present invention, the third upper gas inlet has a third mass flow control unit for independently controlling a flow rate of the third gas. In case the third gas is a mixed gas, the third upper gas inlet has a third mixing ratio control unit for independently controlling a mixing ratio of the third gas. Further, preferably, the third upper gas inlet has a third upper gas injection portion provided in the third region of the upper electrode, for injecting the third gas toward the plasma generation region. The third upper gas injection portion has a plurality of gas injection openings disposed at predetermined specific intervals. Further, the third upper gas inlet has a third gas supply line for supplying the third gas toward the third upper gas injection portion and a third upper buffer space for accumulating the third gas supplied through the third gas supply line in front of the third upper gas injection portion. The third upper gas inlet is made of a material without causing any contamination problem, e.g., Si and SiC, or a heat-resistance material such as quartz.

A gas to be added to the etchant gas can be introduced through the first, the second and the third upper gas inlet while being distributed at an arbitrary ratio. Generally, it is preferable to introduce all or most of the additive gas through the second upper gas inlet or the first and the third upper gas inlet.

In accordance with the plasma etching apparatus of the present invention, by the aforementioned configuration and operation, it is possible to precisely and freely control a flow or a density distribution of a processing gas introduced into a processing chamber, so that etching characteristics can be improved.

DETAILED DESCRIPTION OF THE PREFERRED EMBODIMENT

Hereinafter, preferred embodiments of the present invention will be described with reference to the accompanying drawings.

Figure 1:
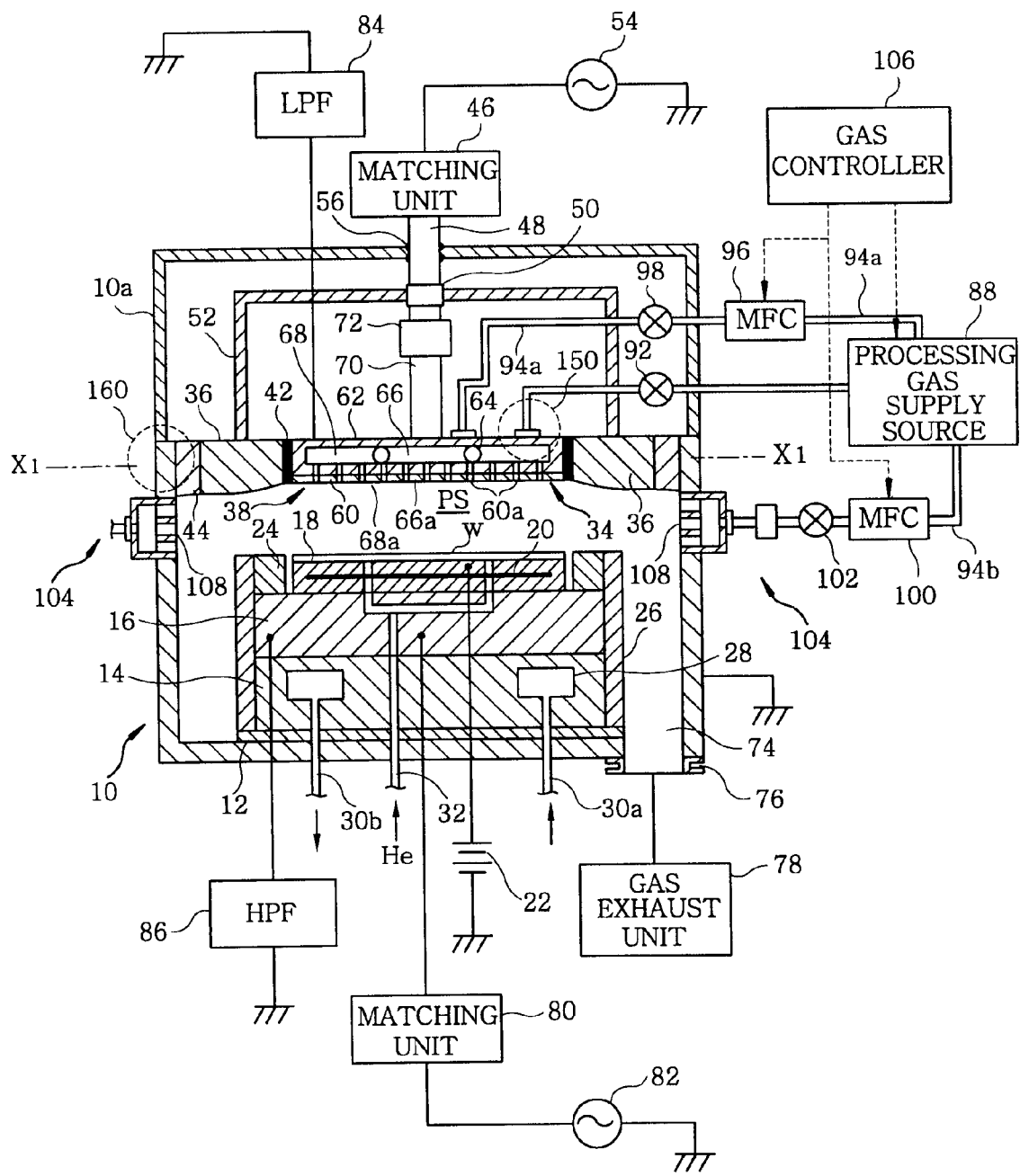
FIG. 1 is a schematic cross-sectional view of a composition of a plasma etching apparatus in accordance with a preferred embodiment of the present invention.

FIG. 1 shows a composition of a plasma etching apparatus in accordance with a preferred embodiment of the present invention. The plasma etching apparatus is a capacitively coupled plasma etching apparatus of a parallel plate electrode structure having a cylindrical chamber (processing chamber) 10 made of aluminum, wherein an inner wall surface thereof is covered with an alumina film or an yttrium oxide ($Y_2O_3$) film. The chamber 10 is frame grounded.

A columnar susceptor support 14 is provided on a bottom of the chamber 10 via an insulating plate 12 made of ceramic or the like. Further, a susceptor 16 made of, e.g., aluminum is installed on the susceptor support 14. The susceptor 16 forms a lower electrode of a parallel plate electrode structure, and a semiconductor wafer W as a substrate to be processed is mounted thereon.

Provided on top of the susceptor 16 is an electrostatic chuck 18 for supporting the semiconductor wafer W with the help of an electrostatic adsorptive force. The electrostatic chuck 18 has a structure in which an electrode 20 made of a conductive film is inserted by being sandwiched between a pair of insulating layers or sheets, and a DC power supply 22 is electrically connected to the electrode 20. Further, the semiconductor wafer W is adsorptively held on the electrostatic chuck 18 by a Coulomb force generated by a DC voltage from the DC power supply 22.

Provided on a top surface of the susceptor 16 so as to surround the electrostatic chuck 18 is a focus ring 24 made of, e.g., silicon for improving an etching uniformity. A cylindrical inner wall member 26 made of, e.g., quartz is provided on lateral surfaces of the susceptor 16 and the susceptor support 14.

A coolant chamber 28 is circumferentially provided inside the susceptor support 14. A coolant, e.g., cooling water kept at a predetermined temperature is supplied from a chiller unit (not shown) installed at an outside into the coolant chambers 28 through lines 30a and 30b to be circulated therein, so that a processing temperature of the semiconductor wafer W on the susceptor 16 can be controlled by using the temperature of the coolant. Moreover, a thermally conductive gas, e.g., He gas, is supplied from a thermally conductive gas supply unit (not shown) to a space between the top surface of the electrostatic chuck 18 and a bottom surface of the semiconductor wafer W through a gas supply line 32.

An upper electrode 34 is installed above the susceptor 16 so as to face the susceptor 16 in parallel. Furthermore, a space between the upper and the lower electrode 16 and 34 forming a parallel plate electrode structure becomes a plasma generation region PS. The upper electrode 34 forms a facing surface, i.e., a surface being in contact with the plasma generation region PS while facing the semiconductor wafer W on the susceptor (lower electrode) 16.

The upper electrode 34 includes an annular or a donut-shaped outer upper electrode 36 which faces the susceptor 16 and is separated therefrom by a predetermined distance; and an insulated circular plate shaped inner upper electrode 38 provided in an inner space of the outer upper electrode 36 along its radial direction. The outer and the inner upper electrode 36 and 38 play a main and a secondary role in a plasma generation, respectively.

Figure 2:
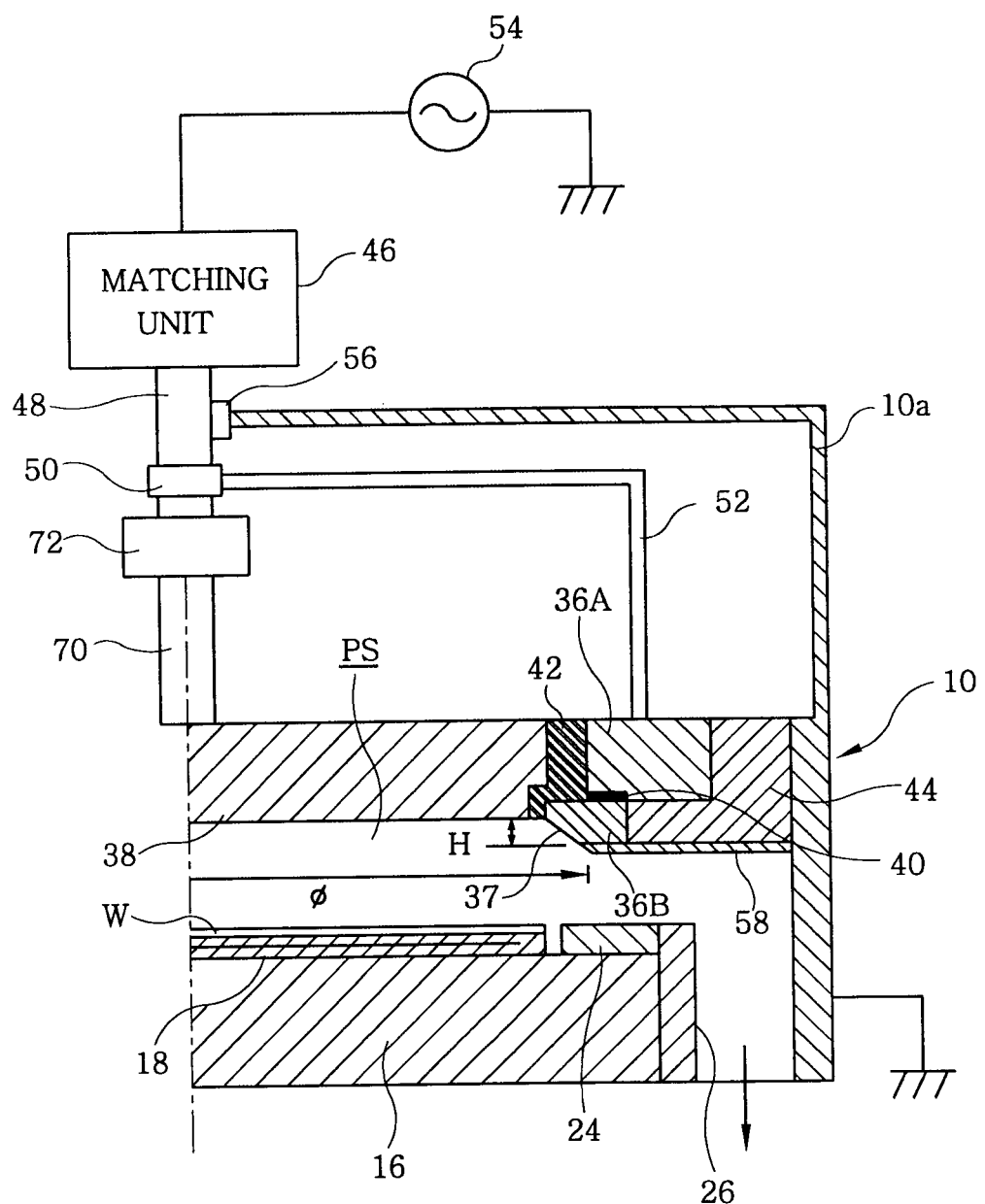
FIG. 2 shows an enlarged cross-sectional view of principal parts of a composition of surroundings of an upper electrode of the plasma etching apparatus.

Hereinafter, arrangements around the upper electrode in this embodiment will be described in detail with reference to FIG. 2. As shown in FIG. 2, the outer upper electrode 36 is divided into an upper electrode member 36A and a lower electrode member 36B. The upper electrode member 36A that is a main body is formed of, e.g., alumite-treated aluminum. The replaceable lower electrode member 36B is made of, e.g., silicon and detachably fixed to the upper electrode member 36A with bolts (not shown) or the like in such a way that it is protruded downwardly from a bottom surface of the inner upper electrode 38 by a protruding amount H. Provided between the electrode members 36A and 36B is a coating or sheet 40 for increasing a thermal conductance.

The protruding amount H and an inner diameter Φ of the lower electrode member 36B of the outer upper electrode 36 determine a strength, a direction or the like of an electric field applied from the outer or the inner upper electrode 36 or 38 to the plasma generation region and further serve as factors for controlling spatial distribution characteristics of a plasma density.

When a high-density plasma is generated, the protruding amount H affects uniformity in an electron density spatial distribution along a diametrical direction of the semiconductor wafer. According to experimental data of the inventors, the protruding amount H is preferably smaller than or equal to 25 mm and, more preferably, about 20 mm. The important thing is that the lower electrode member 36B, i.e., a protrusion of the outer upper electrode 36, serves to confine the plasma in the plasma generation region by forming an electric field from a peripheral portion toward an inner portion thereof along its radial direction in the plasma generation region. Accordingly, in order to achieve the uniformity in the plasma density spatial distribution characteristics, the lower electrode member 36B is preferably positioned further outside in a radial direction from an edge portion of the semiconductor wafer W. Meanwhile, a radial width of the lower electrode member 36B is not critical, so that it can be arbitrarily selected.

In this embodiment, the lower electrode member 36B is formed to have a tapered surface 37 such that the protruding amount thereof gradually decreases toward its central portion, thereby resulting in no right-angled portion (corner portion) formed thereon. With such a tapered surface structure having no angled portion, it is possible to avoid or suppress an adhesion of reaction products generated by a plasma etching.

An annular gap of about 0.25 to 2.0 mm is formed between the outer upper electrode 36 and the inner upper electrode 38. Further, a dielectric material 42 made of, e.g., quartz is provided in the gap, thereby forming a capacitor between the electrodes 36 and 38 having the dielectric material 42 inbetween. The capacitance $C_{42}$ is selected or adjusted to be set at a desired value determined on the basis of a size of the gap and a dielectric constant of the dielectric material 42. Airtightly attached between the outer upper electrode 36 and a sidewall of the chamber is an annular insulating shielding member 44 made of, e.g., alumina ($Al_2O_3$).

A first radio frequency power supply 54 is electrically connected to the upper electrode member 36A of the outer upper electrode 36 via a matching unit 46, an upper power feed rod 48, a connector 50 and a cylindrical power feeder 52. The first radio frequency power supply 54 outputs a radio frequency power of 40 MHz or higher, e.g., 60 MHz, thereby generating a high-density plasma in the plasma generation region. The matching unit 46 matches a load impedance to an internal (or output) impedance of the first radio frequency power supply 54. When the plasma is generated in the chamber 10, the matching unit 46 serves to make the output impedance of the first radio frequency power supply 54 and the load impedance be seemingly matched to each other. An output terminal of the matching unit 46 is connected to a top end of the upper power feed rod 48.

The power feeder 52 is made of a conductive plate, e.g., an aluminum or copper plate, of a cylindrical or conical shape or the like. A lower portion thereof is connected to the upper electrode member 36A of the outer upper electrode 36 continuously along a circumferential direction, whereas an upper portion thereof is electrically connected to a lower portion of the upper power feed rod 48 by the connector 50. Outside the power feeder 52, a sidewall of the chamber 10 upwardly extends to a position higher than the upper electrode 34 to form a cylindrical grounding conductor 10a. An upper portion of the cylindrical grounding conductor 10a is electrically insulated from the upper power feed rod 48 by a general insulation member 56. In such a configuration, a coaxial cable path having the power feeder 52 and the outer upper electrode 36 as a waveguide is formed by the power feeder 52, the outer upper electrode 36 and the cylindrical grounding conductor 10a in a load circuit, viewed from the connector 50.

As shown in FIG. 2, a shielding member 58 is provided on bottom surfaces of a part of the lower electrode member 36B of the outer upper electrode 36 and the insulating shielding member 44. The shielding member 58 is made of, e.g., a thin aluminum plate having an alumite-treated surface, and physically and electrically coupled to a sidewall of the processing chamber 10. Further, the shielding member 58 is horizontally extended from the sidewall of the processing chamber 10 and covers the bottom surfaces of the lower electrode member 36B and the insulating shielding member 44 in a non-contact state or an insulating state. The shielding member 58 serves to block or seal a radio frequency discharge from the bottom surfaces of the lower electrode member 36B of the outer upper electrode 36 and the insulating shielding member 44, thereby suppressing a plasma generation right under those bottom surfaces. Accordingly, the plasma can be more effectively confined in a region right above the semiconductor wafer W.

Referring back to FIG. 1, the inner upper electrode 38 includes an electrode plate 60 having a plurality of gas injection openings 60a, the electrode plate 60 being formed of a semiconductor material such as silicon, silicon carbide or the like; and an electrode support 62 formed of a conductive material, e.g., aluminum, whose surface is treated by an anodic oxidization, for detachably supporting the electrode plate 60.

The inner upper electrode 38 serves as a part of an upper gas introduction mechanism to be described later. Provided inside the electrode support 62 are two upper buffer spaces, i.e., an upper central buffer space 66 and an upper peripheral buffer space 68, partitioned by an annular partition member 64 formed of, e.g., an O-ring. Moreover, an upper central shower head 66a is formed by the upper central buffer space 66 and a plurality of gas injection openings 60a provided in a bottom surface thereof, whereas an upper peripheral shower head 68a is formed by the upper peripheral buffer space 68 and a plurality of gas injection openings 60a provided in a bottom surface thereof. Gas types, gas mixing ratios, gas flow rates or the like can be independently selected or controlled in the upper central shower head 66a and the upper peripheral shower head 68a, respectively.

The electrode plate 60 of the upper electrode 34 is an exchangeable component consumed by an exposure to a plasma. Further, since reaction products are attached to surfaces of the electrode plate 60 and the gas injection openings 60a, a maintenance work is required to remove them. Accordingly, the chamber 10 is dividable into an upper and a lower chamber assembly along a line $X_1$-$X_1$ shown in FIG. 1, and in-chamber members can be taken out by opening and removing the upper assembly.

Electrically connected to the electrode support 62 of the inner upper electrode 38 is the first radio frequency power supply 54 via the matching unit 46, the upper power feed rod 48, the connector 50 and a lower power feed rod 70. A variable capacitor 72 for variably controlling a capacitance is provided in the middle of the lower power feed rod 70.

The variable capacitor 72 adjusts a ratio, i.e., a balance between an outer electric field strength right under the outer upper electrode 36 (or an input power to the outer upper electrode 36) and an inner electric field strength right under the inner upper electrode 38 (or an input power to the inner upper electrode 38). By changing a capacitance $C_{72}$ of the variable capacitor 72 to increase or decrease an impedance or reactance of the waveguide of the lower power feed rod 70 (inner waveguide), it is possible to change a relative fraction of a voltage drop in the waveguide of the power feeder 52 (outer waveguide) and that in the inner waveguide and to control a ratio of the outer electric field strength (outer input power) to the inner electric field strength (inner input power).

As will be described later, a coolant chamber or a coolant passageway (not shown) is provided at a top portion of the outer and the inner upper electrode 36 and 38. Due to a coolant flowing in the coolant passageway from a chiller unit provided at an outside, a temperature of the upper electrode 34 can be regularly controlled.

A gas exhaust port 74 is provided at a bottom portion of the chamber 10, and a gas exhaust unit 78 is connected to the gas exhaust port 74 via a gas exhaust line 76. The gas exhaust unit 78 can depressurize the plasma generation region in the chamber 10 to a desired vacuum level with a vacuum pump such as a turbo vacuum pump or the like. Moreover, provided at a sidewall of the chamber 10 is a gate valve (not illustrated) for opening/closing a gate for loading/unloading the semiconductor wafer W.

In the plasma etching apparatus of this embodiment, a second radio frequency power supply 82 is electrically connected to the susceptor 16 serving as a lower electrode via a matching unit 80. The second radio frequency power supply 82 outputs a radio frequency power ranging from 2 MHz to 20 MHz, e.g., 2 MHz. Herein, the second radio frequency power supply 82 serves to attract ions from the high-density plasma to the semiconductor wafer W.

Electrically connected to the inner upper electrode 38 is a low pass filter (LPF) 84 for passing the radio frequency (2 MHz) from the second radio frequency power supply 82 through the ground without passing the radio frequency (60 MHz) from the first radio frequency power supply 54 therethrough. Although the LPF 84 preferably includes an LR filter or an LC filter, it may also include a single conducting wire capable of applying sufficient reactance to the radio frequency (60 MHz) from the first radio frequency power supply 54. Meanwhile, electrically connected to the susceptor 16 is a high pass filter (HPF) 86 for passing the radio frequency (60 MHz) from the first radio frequency power supply 54 to the ground.

(First embodiment)

Hereinafter, there will be described a gas introduction mechanism for introducing a processing gas (etching gas) into the chamber 10 in the plasma etching apparatus. Major features of the gas introduction mechanism in the first embodiment will be described as follows. As a gas inlet for introducing an etching gas into the plasma generation region PS in the chamber 10, there are provided an upper gas inlet (the upper central shower head 66a and the upper peripheral shower head 68a) for introducing a gas through the upper electrode 38 side and a side gas inlet 104 for introducing a gas through the sidewall side of the chamber 10. As illustrated in FIG. 1, the side gas inlet 104 has a side shower head 108 attached to the sidewall of the chamber 10.

Referring to FIG. 1, a processing gas supply source 88 provides an etchant gas to a gas supply line 90 at a desired flow rate and a dilution gas to a gas supply line 94 at a desired flow rate. The gas supply line 90 communicates with the upper peripheral shower head 68a, and an opening/closing valve 92 is provided therein. Further, the processing gas supply source 88 provides the dilution gas to gas supply branch lines 94a and 94b at desired flow rates, respectively. The gas supply branch line 94a communicates with the upper central shower head 66a, and the gas supply branch line 94b communicates with the side shower head 108. Provided in the gas supply lines 94a and 94b are mass flow controllers (MFC) and 100 and opening/closing valve 98 and 102, respectively.

In accordance with the gas introducing mechanism of this embodiment, the etchant gas is discharged (introduced) through the upper peripheral shower head 68a toward the plasma generation region PS in the chamber 10 and, at the same time, the dilution gas is discharged (introduced) through the upper central shower head 66a and the side shower head 108 toward the plasma generation region PS in the chamber 10. Accordingly, the etchant gas and the dilution gas are mixed in the plasma generation region PS, thereby generating a plasma of the mixed gas.

By controlling the MFCs 96 and 100, a gas control unit 106 can arbitrarily control a flow rate and a flow rate ratio of the dilution gas in the upper central shower head 66a and the side shower head 108. Further, the gas control unit 106 controls a mass flow control unit in the processing gas supply source 88.

Figure 3:
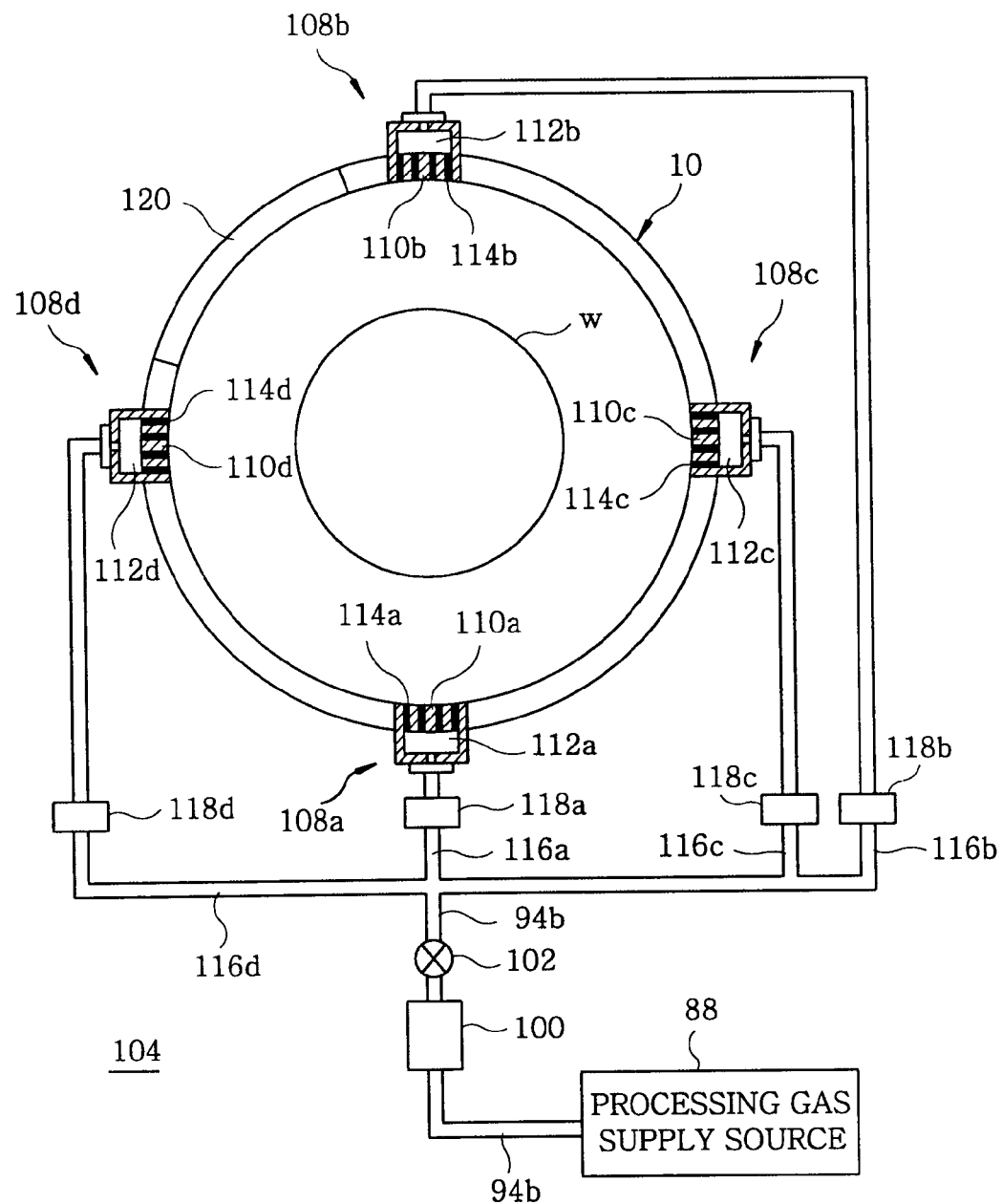
FIG. 3 illustrates a fragmentary sectional top view depicting a detailed composition of a side gas inlet in accordance with a first preferred embodiment.

FIG. 3 depicts a detailed composition of the side gas inlet 104 in this embodiment. As illustrated in FIG. 3, a plurality of (four in this example) side shower heads 108 (108a, 108b, 108c and 108d), which are circumferentially spaced from each other at regular intervals (away from the wafer gate), are installed at the sidewall of the chamber 10.

The side shower heads 108 (108a, 108b, 108c and 108d) have gas injection portions 110 (110a, 110b, 110c and 110d) inserted in the chamber 10 with a thickness of 40 mm to face the plasma generation region PS and side buffer spaces 112 (112a, 112b, 112c and 112d) of a manifold structure provided at an outer wall of the chamber 10 to communicate with the gas injection portions 110, respectively. The gas injection portions 110 are provided with a plurality of gas injection openings 114 (114a, 11b, 114c and 114d). The gas injection portions 110 and the side buffer spaces 112 are preferably made of a semiconductor material such as Si or SiC causing no contamination problem or a heat-resistance material such as quartz. A diameter of the gas injection opening 114 is preferably about 1 mm, for example.

The gas supply line 94b from the processing gas supply source 88 is divided into a plurality of (four) gas supply branch lines 116 (116a, 116b, 116c and 116d) communicating with the respective buffer spaces 112 (112a, 112b, 112c and 112d) of the side shower heads 108 (108a, 108b, 108c and 108d). The gas supply branch lines 116 (116a, 116b, 116c and 116d) are provided with flow rate control valves 118 (118a, 118b, 118c and 118d), respectively. Due to a flow rate controlling function of the flow rate control valves 118 (118a, 118b, 118c and 118d), it is possible to uniformly or arbitrarily and individually control a discharge amount of each of the side shower heads 108 (108a, 108b, 108c and 108d) or a flow rate thereof per unit area.

Figure 4:
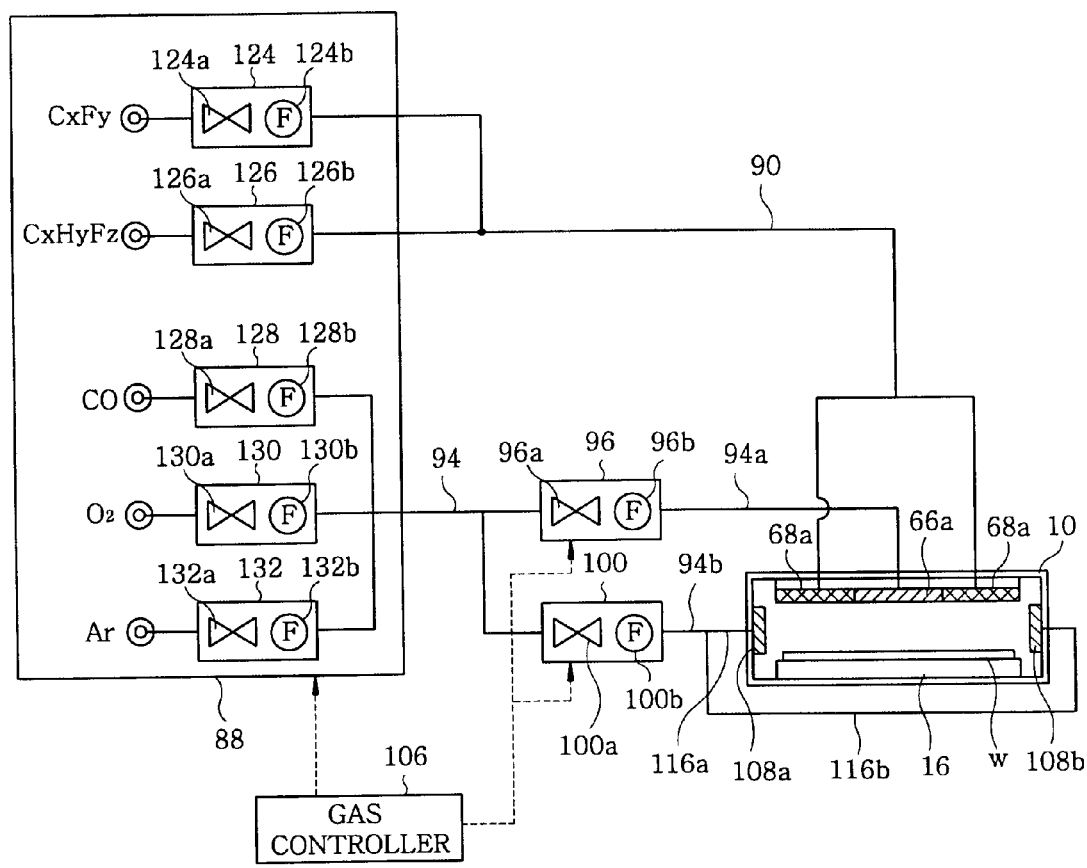
FIG. 4 describes a processing gas flow rate control system in accordance with the first preferred embodiment.

FIG. 4 provides a composition of a processing gas flow rate control system in this embodiment. The processing gas supply source 88 has separate gas supply sources for supplying respective different gases and MFCs. The separate gas supply sources are selected depending on a material to be etched or a processing condition. In this example, there are provided separate gas supply sources of CxFy and CxHyFz as an etchant gas, a separate gas supply source of Ar as a dilution gas and separate gas supply sources of CO and $O_2$ as an additive gas. Herein, CxFy indicates a fluorocarbon-based fluorine compound, e.g., $CF_4$, $C_4F_6$, $C_4F_8$ and $C_5F_8$. Further, CxHyFz indicates a perfluorocarbon-based fluorine compound, e.g., $CH_2F_2$ and $CHF_3$. Furthermore, each of the separate gas supply sources is turned on/off under the control of the control unit 106, and a combination of gas species used in the etching process can be arbitrarily selected.

A CxFy gas from the CxFy supply source or a CxHyFz gas from the CxHyFz supply source is provided to the gas supply line 90 via the MFC 124 or 126 and then supplied to the upper peripheral shower head 68a provided at a top portion of the chamber 10 through the gas supply line 90. The control unit 106 controls a flow rate of the etchant gas, i.e., the CxFy gas or the CxHyFx gas supplied to the upper peripheral shower head 68a, by controlling the MFC 124 or 126.

CO gas from the CO supply source, $O_2$ gas from the $O_2$ supply source and Ar gas from the Ar supply source are provided to the gas supply line 94 via the MFCs 128, 130 and 132, respectively, and then mixed in the gas supply line 94. The control unit 106 controls flow rates of the CO gas, the $O_2$ gas and the Ar gas by controlling the MFCs 128, 130 and 132 and hence a mixing ratio of the mixed $CO/O_2/Ar$ gas.

A part of the mixed dilution gas of $CO/O_2/Ar$ formed in the gas supply line 94 is provided to the gas supply line 94a via the MFC 96 and then supplied to the upper central shower head 66a provided at the top portion of the chamber 10 through the gas supply line 94a. A remaining mixed dilution gas of $CO/O_2/Ar$ is provided to the gas supply line 94b via the MFC 100 and then supplied to the side shower heads 108 (108a, 108b, 108c and 108d) provided on the sidewall of the chamber 10 through the gas supply line 94b. The control unit 106 controls a flow rate and a flow rate ratio of the mixed dilution gas of $CO/O_2/Ar$ supplied to the upper central shower head 66a and those of the mixed dilution gas of $CO/O_2/Ar$ supplied to the side shower head 108 by controlling the MFCs 96 and 100.

In the MFCs 96, 100, 124, 126, 128, 130 and 132, opening degrees of the flow rate control valves 96a, 100a, 124a, 126a, 128a, 130a and 132a are adjusted based on gas flow rates detected by the flowmeters 96b, 100b, 124b, 126b, 128b, 130b and 132b, respectively.

Figure 5:
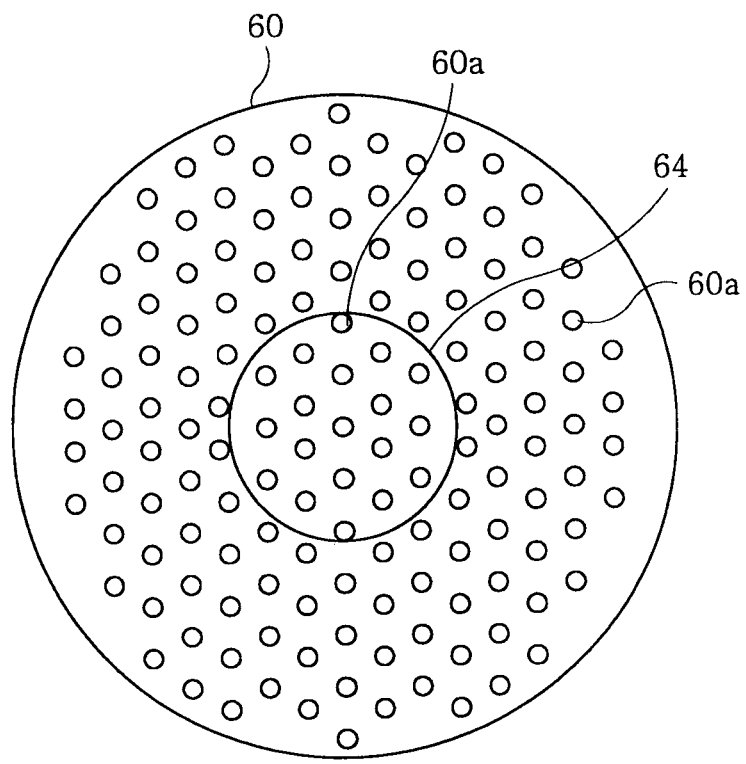
FIG. 5 provides a top view showing a distribution pattern of gas injection openings in an upper shower head in accordance with the first preferred embodiment.

FIG. 5 describes an exemplary distribution pattern of gas injection openings 60a provided in gas injection portions of the upper central shower head 66a and the upper peripheral shower head 68a. As shown in FIG. 5, the gas injection openings 60a are spaced from each other at predetermined pitches or intervals in the electrode plate 60 of the inner upper electrode 38 and are distributed in a predetermined ratio in the upper central shower head 66a and the upper peripheral shower head 68a partitioned by the annular partition member 64. The illustrated distribution pattern is for an exemplary purpose only, and a radial pattern, a concentric pattern, a matrix pattern or the like may be employed.

Figure 6:
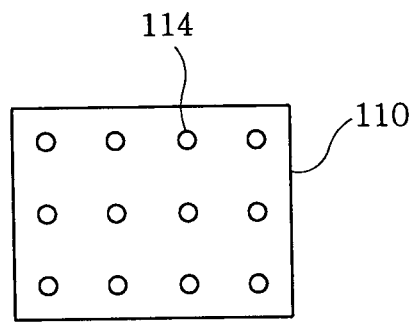
FIG. 6 presents a top view illustrating a distribution pattern of gas injection openings in a side shower head in accordance with the first preferred embodiment.

FIG. 6 presents an exemplary distribution pattern of the gas injection openings 114 provided at the gas injection portion 110 of the side shower head 108. In this example, the gas injection portion 110 is formed in a rectangular shape, and the gas injection openings 114 are spaced from each other at predetermined pitches in a matrix pattern in the X and the Y direction. Such configuration is an exemplary purpose only, and the gas injection portion 110 may have a circular shape and the distribution pattern of the gas injection openings 114 may be distributed in a radial pattern, a concentric circular pattern or the like. Optimal shape and pattern can be selected by repeating experiments or trials.

Hereinafter, an operation of the plasma etching apparatus in this embodiment will be described. In the plasma etching apparatus, in order to perform an etching process, a semiconductor wafer W to be processed is loaded into the chamber 10 through a gate (not shown) provided on the sidewall of the chamber and then mounted on the susceptor 16 while a gate valve (not shown) is opened. Next, a DC voltage is applied from the DC power supply 22 to the electrode 20 of the electrostatic chuck 18, and the semiconductor wafer W is fixed on the susceptor 16.

Etching gases of predetermined flow rates are introduced through the shower heads 66a, 68a and 108 of a triple system into the plasma generation region PS between the upper electrode 34 (36 and 38) and the susceptor (lower electrode) 16 by the aforementioned gas introduction mechanism. In other words, the dilution gas containing an additive gas is introduced through the upper central shower head 66a at a predetermined flow rate; the etchant gas is introduced through the upper peripheral shower head 68a at another predetermined flow rate; and the dilution gas containing an additive gas is introduced through the side shower head 108 at yet another predetermined flow rate. The gases from the triple system, which are introduced into the plasma generation region PS, are mixed and become a mixed gas. Meanwhile, an inner pressure of the chamber 10 is depressurized to a preset value (e.g., $10^{-1}$ Pa to $10^2$ Pa) by the gas exhaust unit 78. Moreover, a power of a radio frequency (60 MHz) for generating a plasma is applied from the first radio frequency power supply 54 to the upper electrode 34 (36 and 38). And also, a power of a radio frequency (2 MHz) is applied from the second radio frequency power supply 82 to the susceptor 16.

By application of such powers, a glow discharge is generated between the upper electrode 34 (36 and 38) and the susceptor (lower electrode) 16 to plasmarize the etching gas in the chamber 10. Then, a to-be-processed surface of the semiconductor wafer W is etched by radicals and/or ions generated in the plasma.

In such plasma etching apparatus, by applying a radio frequency power of a radio frequency domain (above 5 MHz to 10 MHz where ions are immovable) to the upper electrode 34, it is possible to form a high density plasma in a desirable dissociation state under a lower pressure condition.

Moreover, in the upper electrode 34, the outer upper electrode 36 and the inner upper electrode 38 are used as a main and a secondary radio frequency electrode for generating a plasma, respectively. Since a ratio of an electric field strength applied from the electrodes 36 and 38 to electrons right below those electrodes can be adjusted, a spatial distribution of a plasma density can be controlled in a diametric direction and, further, spatial characteristics of a reactive ion etching can be arbitrarily and precisely controlled.

In addition, in such plasma etching apparatus, most or majority of the plasma is generated right under the outer upper electrode 36 and then diffused to portions right under the inner upper electrode 38. Therefore, since the inner upper electrode 38 serving as a shower head is less bombarded by plasma ions, a sputtering at the gas injection openings 56a of the replaceable electrode plate 60 can be effectively suppressed, resulting in a considerably increased lifespan of the electrode plate 60. Meanwhile, since the outer upper electrode 36 does not have gas injection openings where an electric field is concentrated, the ion bombardment thereto is small and, thus, the lifespan thereof is not shortened.

In such plasma etching apparatus, types, mixing ratios, flow rates or the like of gases introduced through the shower heads 66a, 68a and 108 of the triple system into the plasma generation region PS in the chamber 10 are balanced. Accordingly, it is possible to optimize the spatial distribution characteristics, e.g., an etching rate, an etching shape or the like, for various etching processes.

Figure 7:
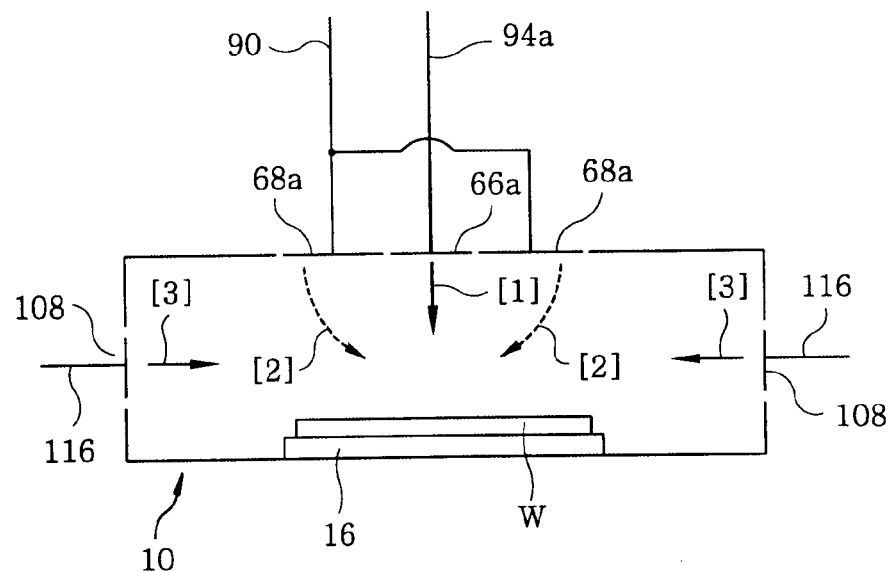
FIG. 7 represents a schematic cross-sectional view schematically depicting a processing gas flow in a chamber in accordance with the first preferred embodiment.
Figure 8:
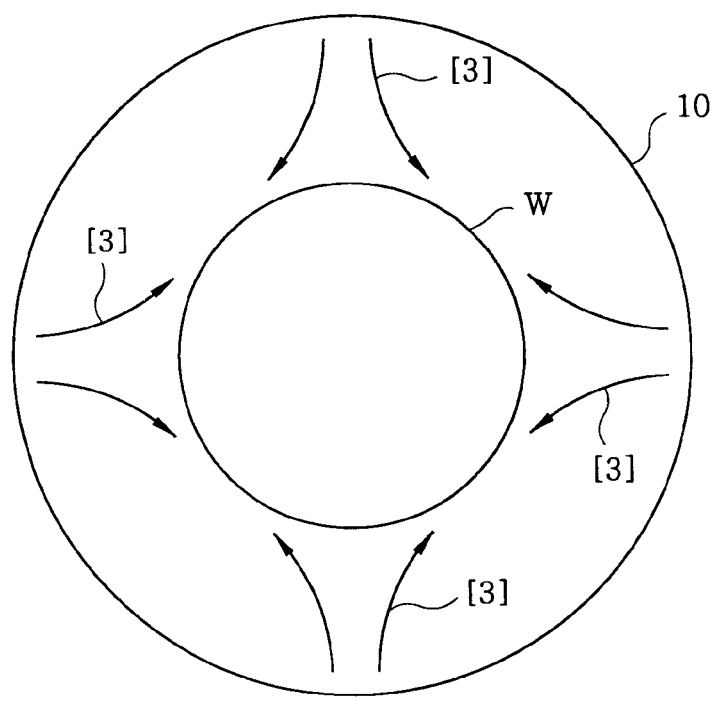
FIG. 8 offers a schematic top view schematically depicting the processing gas flow in the chamber in the first preferred embodiment.

FIGS. 7 and 8 schematically represent a pattern of a flow of a processing gas in the chamber 10 (especially, in the plasma generation region PS). Hereinafter, a gas introduction method of this embodiment in a specified etching process will be descried with reference to FIGS. 7 and 8.

As a specific example, there will be described a case where a contact hole is formed in a silicon oxide film or a silicon nitride film for covering a semiconductor device forming a semiconductor apparatus. In such etching process, it is preferable to use a perfluorocarbon-based gas such as $CH_2F_2$ gas or $CHF_3$ gas as an etchant gas and CO gas or $O_2$ gas as an additive gas. However, if the perfluorocarbon-based gas is used as the etchant gas, an organic polymer may be formed due to radicals of an etching gas generated by a plasma excitation. Especially, reaction products may be adhered to a peripheral region of the semiconductor wafer W and, further, an acute tapered contact hole tends to be formed in the peripheral region of the wafer by deposits of the reaction products.

Therefore, as depicted in FIG. 7, a balance is adjusted such that a flow rate of an Ar flow [3] discharged through the side shower head 108 into the chamber 10 becomes greater than that of an Ar flow [1] discharged through the upper central shower head 66a into the chamber 10. With such balance adjustment, a perfluorocarbon-based etchant gas flow [2] introduced through the upper peripheral shower head 68a into the chamber 10 flows more right under the inner upper electrode 38 than the outer upper electrode 36. Accordingly, the radicals of the etchant are reduced in the peripheral region of the semiconductor wafer W. Further, argon ions generated by the plasmarization of Ar gas function to remove the aforementioned reaction products by sputtering. Due to those operations, the deposition amount of the reaction products becomes reduced in the peripheral region of the semiconductor wafer W, which improves the acute tapered shape of the contact hole. As a result, a cross sectional shape of the contact hole in a surface of the semiconductor wafer W becomes uniform.

As illustrated in FIG. 8, the Ar flow [3] discharged through the side shower head 108 becomes extended further widely toward the peripheral portion of the semiconductor wafer W. Thus, it is preferable to discharge more $O_2$ gas and CO gas both of which are capable of removing the reaction products from the side shower head 108.

Hereinafter, as an additional specific example of the etching process, there will be described a case where a via hole or a Damascene wiring groove is formed in an interlayer insulating film of a multilayer interconnection structure provided on a top layer of the semiconductor device. Such interlayer insulating film is formed of an insulating layer having a lower dielectric constant than that of a silicon oxide film, e.g., a silicon oxide film, a SiC film, a SiOC film or the like containing a methyl group or an ethyl group. Therefore, in case the via hole or a Damascene wiring groove is formed in the interlayer insulating film, a hard mask formed of a silicon oxide film or a silicon nitride film is used. In such case, a fluorocarbon-based gas, e.g., $C_4F_8$ gas, can be preferably used as the etchant gas.

In case such fluorocarbon-based etchant gas is used, flow rates of the Ar flow [1] discharged through the upper central shower head 66a into the chamber 10 and the Ar flow [3] discharged through the side shower head 108 into the chamber 10 are adjusted such that the former is greater than the latter. In other words, the balance in the flow rates thereof is adjusted reversely to that done in the case where the contact hole is formed, so that the cross sectional profile of the via hole or the Damascene wiring groove in the surface of the semiconductor wafer W becomes uniform. In this case, it is preferable to introduce more CO gas or $O_2$ gas for removing the reaction products through the upper central shower head 66a.

By discharging Ar gas and $O_2$ gas or CO gas for removing the reaction products through the upper central shower head 66a and the side shower head 108 to maintain the etchant gas introduced through the upper peripheral shower head 68a between the central portion and the side portion and, further, by appropriately adjusting the balance of the gas injection amount between the upper central shower head 66a and the side shower head 108, it is possible to freely and optimally control the etching characteristics on the semiconductor wafer W in various etching processes (e.g., regardless of whether the amount of reaction products is large or small).

(Second embodiment)

Hereinafter, a gas introduction mechanism of a second preferred embodiment, for introducing a processing gas (an etching gas) into the chamber 10 in the plasma etching apparatus, will be described with reference to FIGS. 9 to 11. A major feature of the gas introduction mechanism in accordance with the second preferred embodiment is that instead of the side gas inlet 104 in the first preferred embodiment, a third upper shower head is provided at an outer portion of the upper peripheral shower head 68a as a gas inlet for introducing an etching gas into the plasma generation region PS in the chamber 10. In other words, the gas introduction mechanism of the second preferred embodiment includes a first upper shower head (the upper central shower head of the first preferred embodiment), a second upper shower head (the upper peripheral shower head of the first preferred embodiment) and the third upper shower head, which are sequentially provided from the central portion of the upper electrode toward the outer portion thereof in a diametric direction. The compositions other than the gas introduction mechanism in the plasma etching apparatus are identical to those of the first preferred embodiment.

Figure 9:
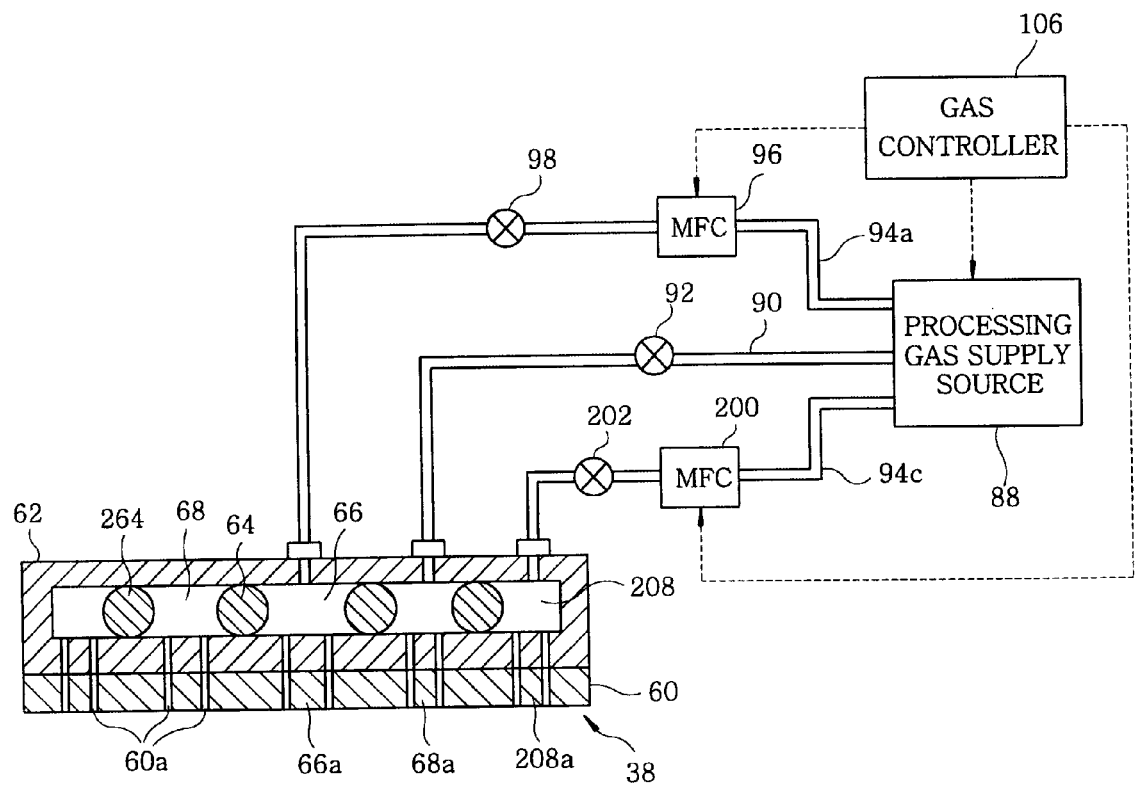
FIG. 9 illustrates a composition of principal parts of a gas introduction mechanism in accordance with a second preferred embodiment.

FIG. 9 illustrates a composition of principal parts of the gas introduction mechanism of the second preferred embodiment. The inner upper electrode 38 includes an electrode plate 60 formed of a semiconductor material such as Si, SiC or the like, the electrode plate 60 having a plurality of gas injection openings 60a; and an electrode support 62 formed of a conductive material, e.g., aluminum whose surface is treated by an anodic oxidization, for detachably supporting the electrode plate 60.

The inner upper electrode 38 serves as a part of an upper gas introduction mechanism to be described later. Provided inside the electrode support 62 are three upper buffer spaces, i.e., a first upper buffer space 66, a second upper buffer space 68 and a third upper buffer space 208, partitioned by annular partition members 64 and 264 formed of, e.g., O-rings. Moreover, a first upper shower head 66a includes the first upper buffer space 66 and a plurality of gas injection openings 60a provided in a bottom surface thereof; a second upper shower head 68a includes the second upper buffer space 68 and a plurality of gas injection openings 60a provided in a bottom surface thereof; and a third upper shower head 208a includes the third upper buffer space 208 and a plurality of gas injection openings 60a provided in a bottom surface thereof. Gas species, gas mixing ratios, gas flow rates or the like can be independently selected or controlled in the first, the second and the third upper shower head 66a, 68a and 208a, respectively.

Referring to FIG. 9, a processing gas supply source 88 provides an etchant gas to a gas supply line 90 at a desired flow rate and a dilution gas to a gas supply line 94 at a desired flow rate. The gas supply line 90 communicates with the second upper shower head 68a and an opening/closing valve 92 is provided therein. Further, the processing gas supply source 88 provides the dilution gas to gas supply lines 94a and 94c at desired flow rates, respectively. The gas supply line 94a communicates with the first upper shower head 66a, and the gas supply line 94c communicates with the third upper shower head 208a. Provided in the gas supply lines 94a and 94c are MFCs 96 and 200 and opening/closing valves 98 and 202, respectively.

In accordance with the gas introducing mechanism of the second preferred embodiment, the etchant gas is discharged (introduced) through the second upper shower head 68a toward the plasma generation region PS in the chamber 10 and, at the same time, the dilution gas is discharged (introduced) through the first and the third upper shower head 66a and 208a toward the plasma generation region PS in the chamber 10. Accordingly, the etchant gas and the dilution gas are mixed in the plasma generation region PS, thereby generating a plasma of the mixed gas.

By controlling the MFCs 96 and 200, a gas control unit 106 can arbitrarily control a flow rate and a flow rate ratio of the dilution gas in the first and the third upper shower head 66a and 208a. Further, the gas control unit 106 controls a mass flow control unit in the processing gas supply source 88.

Figure 10:
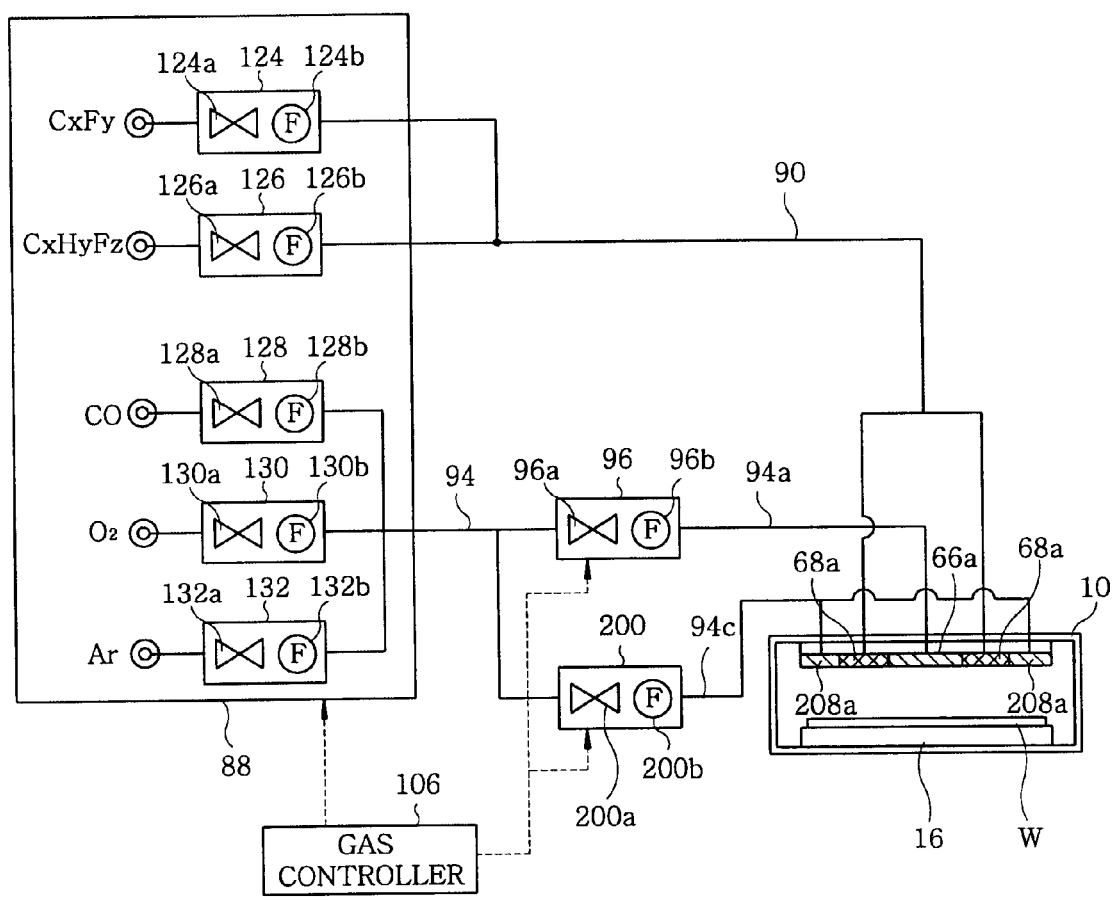
FIG. 10 describes a composition of a processing gas flow rate control system in accordance with the second preferred embodiment.

FIG. 10 provides a composition of a processing gas flow rate control system in this embodiment. The processing gas supply source 88 has separate gas supply sources for supplying respective different gases and MFCs. The separate gas supply sources are selected depending on a material to be etched or a processing condition. In this example, as in the first preferred embodiment, there are provided separate gas supply sources of CxFy and CxHyFz as an etchant gas, a separate gas supply source of Ar as a dilution gas and separate gas supply sources of CO and $O_2$ as additive gases. Further, each of the separate gas supply sources is turned on/off under the control of the control unit 106, and a combination of gas species used in the etching process can be arbitrarily selected.

A CxFy gas from the CxFy supply source or a CxHyFz gas from the CxHyFz supply source is provided to the gas supply line 90 via the MFC 124 or 126 and then supplied to the second upper shower head 68a provided at a top portion of the chamber 10 through the gas supply line 90. The control unit 106 controls a flow rate of the etchant gas, i.e., the CxFy gas or the CxHyFx gas supplied to the second upper shower head 68a, by controlling either the MFC 124 or 126.

CO gas from the CO supply source, $O_2$ gas from the $O_2$ supply source and Ar gas from the Ar supply source are provided to the gas supply line 94 via the MFCs 128, 130 and 132, respectively, and then mixed in the gas supply line 94. The control unit 106 controls flow rates of the CO gas, the $O_2$ gas and the Ar gas by controlling the MFCs 128, 130 and 132, respectively, and hence a mixing ratio of the mixed gas of $CO/O_2/Ar$.

A part of the mixed dilution gas of $CO/O_2/Ar$ formed in the gas supply line 94 is provided to the gas supply line 94a via the MFC 96 and then supplied to the first upper shower head 66a provided at the top portion of the chamber through the gas supply line 94a. The remaining mixed dilution gas of $CO/O_2/Ar$ is provided to the gas supply line 94c via the MFC 200 and then supplied to the third upper shower head 208a provided at the top portion of the chamber 10 through the gas supply line 94c. The control unit 106 controls a flow rate and a flow rate ratio of the mixed dilution gas of $CO/O_2/Ar$ supplied to the first upper shower head 66a and those of the mixed dilution gas of $CO/O_2/Ar$ supplied to the third upper shower head 208a by controlling the MFCs 96 and 200.

In the MFCs 96, 100, 124, 126, 128, 130 and 132, opening degrees of the flow rate control valves 96a, 100a, 124a, 126a, 128a, 130a and 132a are adjusted based on gas flow rates detected by the flowmeters 96b, 100b, 124b, 126b, 128b, 130b and 132b, respectively.

Although it is not illustrated, the gas injection openings 60a provided at a gas injection portion of the first, the second and the third upper shower head 66a, 68a and 208a are spaced from each other at predetermined pitches or intervals in the electrode plate 60 of the inner upper electrode 38 and are distributed in a predetermined ratio at the first, the second and the third upper shower head 66a, 68a and 208a partitioned by the annular partition members 64 and 264. Further, the gas injection openings may be distributed in a radial pattern, a concentric circular pattern, a matrix pattern or the like.

Hereinafter, an operation of the plasma etching apparatus of the second preferred embodiment will be described. In the plasma etching apparatus, in order to perform an etching process, a semiconductor wafer W to be processed is loaded into the chamber 10 through a gate (not shown) provided on the sidewall of the chamber and then mounted on the susceptor 16 while a gate valve (not shown) is opened. Next, a DC voltage is applied from the DC power supply 22 to the electrode 20 of the electrostatic chuck 18, and the semiconductor wafer W is fixed on the susceptor 16.

Etching gases of predetermined flow rates are respectively introduced from the shower heads 66a, 68a and 208a of a triple system into the plasma generation region PS between the upper electrode 34 (36 and 38) and the susceptor (lower electrode) 16 by the aforementioned gas introduction mechanism. In other words, the dilution gas containing an additive gas is introduced through the first shower head 66a at a predetermined flow rate; the etchant gas is introduced through the second shower head 68a at a predetermined flow rate; and the dilution gas containing an additive gas is introduced through the third upper shower head 208a at a predetermined flow rate. The gases from the triple system, which are introduced into the plasma generation region PS, are mixed and become a mixed gas. Meanwhile, an inner pressure of the chamber 10 is depressurized to a preset value (e.g., $10^{-1}$ Pa to $10^2$ Pa) by the gas exhaust unit 78. Moreover, a power of a radio frequency (60 MHz) for generating a plasma is applied from the first radio frequency power supply 54 to the upper electrode 34 (36 and 38). And also, a power of a radio frequency (2 MHz) is applied from the second radio frequency power supply 82 to the susceptor 16.

By application of such powers, a glow discharge occurs between the upper electrode 34 (36 and 38) and the susceptor (lower electrode) 16 to thereby plasmarize the etching gas in the chamber 10. Then, a to-be-processed surface of the semiconductor wafer W is etched by radicals and/or ions generated in the plasma.

In such plasma etching apparatus of the second preferred embodiment, species, mixing ratios, flow rates or the like of gases introduced through the shower heads 66a, 68a and 208a of the triple system into the plasma generation region PS in the chamber 10 are balanced. Accordingly, it is possible to optimize the spatial distribution characteristics such as an etching rate, an etching shape or the like, in various etching processes.

Figure 11:
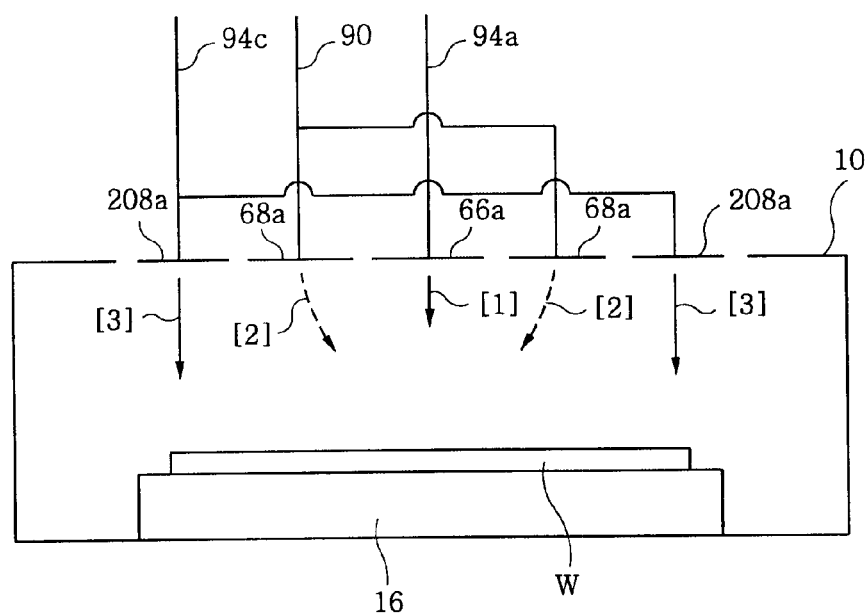
FIG. 11 provides a schematic sectional view schematically depicting a processing gas flow in a chamber in accordance with the second preferred embodiment.

FIG. 11 schematically represents a flow of a processing gas in the chamber 10 (especially, in the plasma generation region PS). Hereinafter, a gas introduction method of this embodiment in a specified etching process will be described with reference to FIG. 11.

As a specific example, there will be described a case where a contact hole is formed in a silicon oxide film or a silicon nitride film for covering a semiconductor device forming a semiconductor apparatus as in the first preferred embodiment. In such etching process, it is preferable to use a perfluorocarbon-based gas such as $CH_2F_2$ gas or $CHF_3$ gas as an etchant gas and CO gas or $O_2$ gas as an additive gas. However, if the perfluorocarbon-based gas is used as the etchant gas, an organic polymer may be formed due to radicals of an etching gas generated by a plasma excitation. Especially, reaction products may be adhered to a peripheral region of the semiconductor wafer W and, further, an acute tapered contact hole tends to be formed in the peripheral region of the wafer by deposits of the reaction products.

Therefore, as depicted in FIG. 11 a balance is adjusted such that a flow rate of an Ar flow [3] discharged through the third upper shower head 208a into the chamber 10 becomes greater than that of an Ar flow [1] discharged through the first upper shower head 66a into the chamber 10. With such balance adjustment, a perfluorocarbon-based etchant gas flow [2] introduced through the second upper shower head 68a into the chamber 10 flows more right under the inner upper electrode 38 than right under the outer upper electrode 36. Accordingly, the radicals of the etchant are reduced in the peripheral region of the semiconductor wafer W. Further, argon ions generated by the plasmarization of Ar gas function to remove the aforementioned reaction products by sputtering. Due to those operations, the deposition amount of the reaction products becomes reduced in the peripheral region of the semiconductor wafer W, which improves an acute tapered shape of the contact hole. As a result, a cross sectional shape of the contact hole in a surface of the semiconductor wafer W becomes uniform.

Hereinafter, as an additional specific example of the etching process, there will be described a case where a via hole or a Damascene wiring groove is formed in an interlayer insulating film of a multilayer interconnection structure provided on a top layer of the semiconductor device, as in the first preferred embodiment. Such interlayer insulating film is formed of an insulating layer having a lower dielectric constant than that of a silicon oxide film, e.g., a silicon oxide film, a SiC film, a SiOC film or the like containing a methyl group or an ethyl group. Therefore, in case the via hole or a Damascene wiring groove is formed in the interlayer insulating film, a hard mask formed of a silicon oxide film or a silicon nitride film is used. In this case, it is preferable to use a fluorocarbon-based gas, e.g., $C_4F_8$ gas, as the etchant gas.

In case such fluorocarbon-based etchant gas is used, a flow rate of the Ar flow [1] discharged through the first upper shower head 66a into the chamber 10 and that of the Ar flow [3] discharged through the third upper shower head 208a into the chamber 10 are adjusted such that the former is greater than the latter. In other words, the balance of the flow rates thereof are adjusted reversely to that done in the case where the contact hole is formed, so that the cross sectional profile of the via hole or the Damascene wiring groove in the surface of the semiconductor wafer W becomes uniform. In this case, it is preferable to introduce more CO gas or $O_2$ gas for removing the reaction products from the first upper shower head 66a.

By discharging Ar gas and $O_2$ gas or CO gas for removing the reaction products from the first and the third upper shower head 66a and 208a to maintain the etchant gas introduced through the second upper shower head 68a between the central portion and the side portion and, further, by appropriately adjusting the balance of the gas injection amount between the first and the third upper shower head 66a and 208a, it is possible to freely and optimally control the etching characteristics on the semiconductor wafer W in various etching processes (e.g., regardless of whether the amount of reaction products is large or small).

Although it is not illustrated, it is possible to add the side shower head 108 of the first preferred embodiment to the gas introduction mechanism of the second preferred embodiment.

Figure 12:
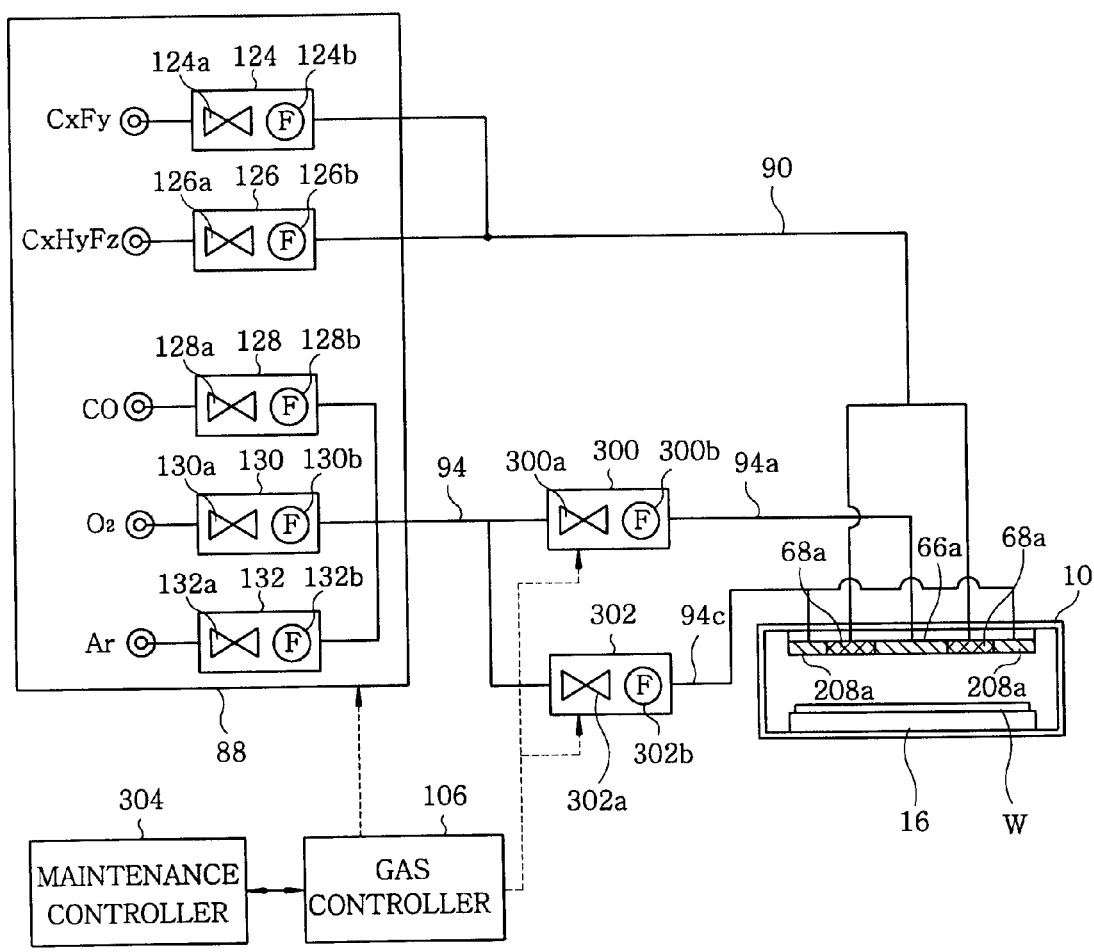
FIG. 12 presents an additional example of a processing gas flow rate control system in accordance with the second preferred embodiment.

Hereinafter, a modified example (an additional example) of the processing gas flow rate control system in this embodiment will be described with reference to FIGS. 12 to 15. FIG. 12 shows a composition of the modified example. The parts common to the system of FIG. 10 will be assigned like reference numerals. In such processing gas flow rate control system, flow rates or distribution amounts of the dilution gas to be distributed to the first and the third shower head 66a and 208a, respectively, are controlled by a pressure control unit PCV, thereby achieving a high responsiveness to a change of a gas species.

Referring to FIG. 12, in the processing gas supply source 88, CO gas from the CO supply source, $O_2$ gas from the $O_2$ supply source and Ar gas from the Ar supply source are provided to the gas supply line 94 via the MFCs 128, 130 and 132, respectively, and then mixed in the gas supply line 94. The control unit 106 controls flow rates of the CO gas, the $O_2$ gas and the Ar gas and hence a mixing ratio of the mixed gas of $CO/O_2/Ar$ by controlling the MFCs 128, 130 and 132.

A part of the mixed dilution gas of $CO/O_2/Ar$ formed in the gas supply line 94 is provided to the gas supply line 94a via a first PCV 300 and then supplied to the first shower head 66a provided at the top portion of the chamber 10 through the gas supply line 94a. Herein, the first PCV 300 has a pressure control valve 300a, e.g., a normal open type air operator valve, and a pressure sensor 300b. The remaining mixed dilution gas of $CO/O_2/Ar$ is provided to the gas supply line 94b via a second PCV 302 forming a mass flow control unit and then supplied to the third shower head 208a provided at the top portion of the chamber 10 through the gas supply line 94c. The second PCV 302 also has a pressure control valve 302a, e.g., a normal open type air operator valve, and a pressure sensor 302b.

The gas control unit 106 adjusts respective opening degrees of the pressure control valves 300a and 302a in the first and the second PCV 300 and 302. In this case, it is possible to adjust the opening degrees of both or either one of the pressure control valves 300a and 302a. For example, an arbitrary pressure ratio can be selected by adjusting the opening degree of the pressure control valve 302a whose output pressure becomes relatively lower while keeping the pressure control valve 300a whose output pressure becomes relatively higher fully opened. With such pressure ratio control, it is possible to arbitrarily control a ratio of a flow rate of the mixed dilution gas of $CO/O_2/Ar$ supplied to the first shower head 66a to that of the mixed dilution gas of $CO/O_2/Ar$ supplied to the third shower head 208a.

Monitored pressure signals respectively outputted from the pressure sensors 300b and 302b of the PCVs 300 and 302 are transmitted to a maintenance control unit 304 via the gas control unit 106. The maintenance control unit 304 includes a microcomputer and performs a maintenance process to be described later based on the monitored pressures (pressure measurement values) from the pressure sensors 300b and 302b.

In accordance with this example, in case preset values of the flow rates (gas distribution amounts) of the dilution gas to be distributed respectively to the first and the third shower head 66a and 208a are changed, the gas control unit 106 can control both or either one of the pressure control valves 300a and 302a in response to a command from a main control unit such that the gas flow rate can be instantly changed. Accordingly, it is possible to adjust a balance of the gas flow rate ratio between the Ar flow [1] discharged (introduced) through the first shower head 66a into the chamber 10 and the Ar flow [3] discharged (introduced) through the third shower head 208a into the chamber 10 with high accuracy during the etching process. By improving such function of adjusting a flow rate balance, it is possible to improve etching characteristics such as a uniformity of an in-surface etching shape of the semiconductor wafer W or the like. Moreover, a flow rate ratio controlling method employing the aforementioned pressure control unit is not limited to the gas distribution to the first and the third shower head 66a and 208a, and may be applied to an arbitrary application for performing the same gas distribution.

As described above, the processing gas flow rate control system of FIG. 12 can respond more rapidly to a change of a gas flow rate compared to the processing gas flow rate control system described in FIG. 10. However, it has a drawback in which the accuracy of a gas distribution amount is easily affected by a conductance change of a gas channel at a downstream of the pressure control units (the PCVs 300 and 302). In such case, a monitoring and a maintenance of the pressure control unit become significant.

Hereinafter, a desired maintenance work for the pressure control unit in this embodiment will be described. The maintenance work is mainly performed by a maintenance processing unit 304 and includes 'gas pressure span deviation (error) check', 'gas pressure stability check' and a determination process thereof.

(Gas Pressure Span Deviation Check)

Figure 13A:
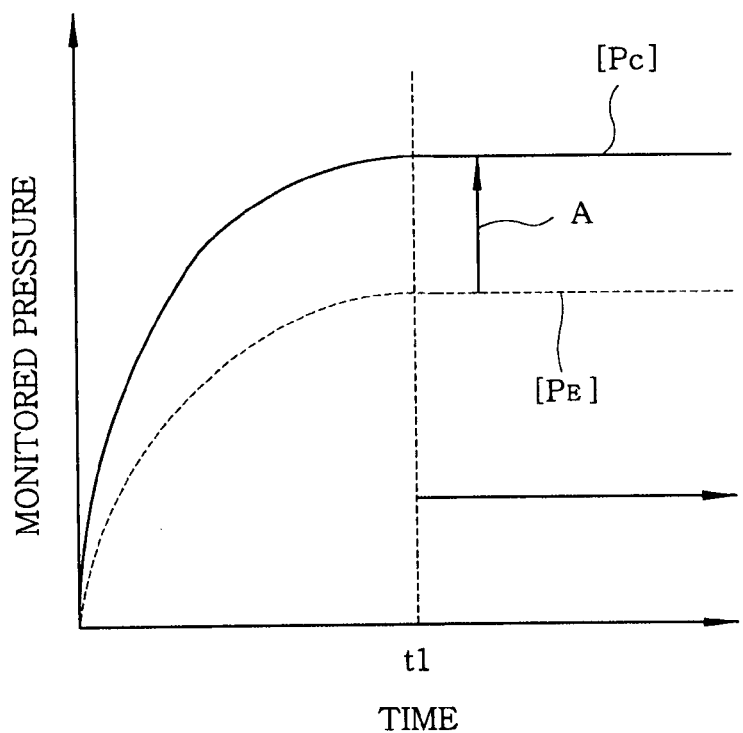
FIG. 13A represents a graph of a pressure being monitored for a maintenance of two PCVs forming a flow rate ratio control unit of the processing gas flow rate control system.
Figure 13B:
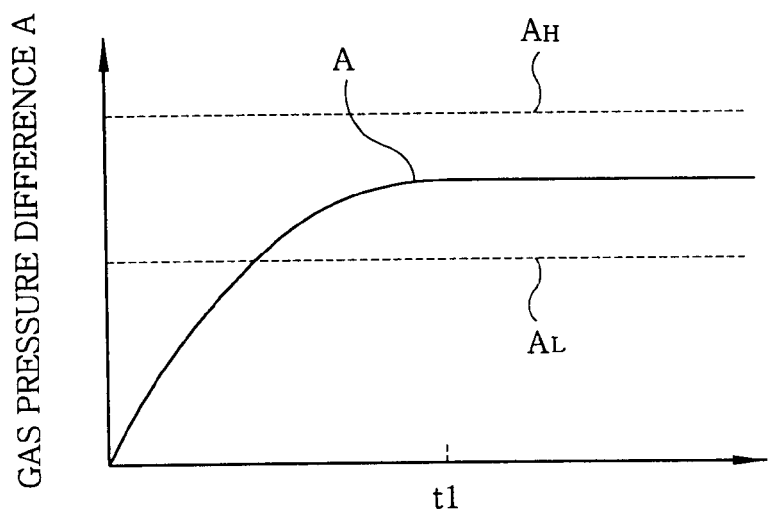
FIG. 13B depicts a monitored pressure difference in FIG. 13A.

For instance, during a process for purging an inner space of the chamber 10 with $N_2$ gas, the respective pressure control valves 300a and 302a of the first and the second PCV 300 and 302 are fully opened, as described above. Further, the $N_2$ gas is supplied at a predetermined flow rate from an $N_2$ gas supply source (not shown) to the gas supply line 94 while keeping an exhaust rate of the inside of the chamber constant. Accordingly, as illustrated in FIG. 13A, monitored pressures $P_C$ and $P_E$ (pressure measurement values) obtained from the pressure sensors 300b and 302b of the PCVs 300 and 302 start to increase exponentially when the N2 gas supply begins to reach at stable constant pressures $[P_C]$ and $[P_E]$. In general, since the first shower head 66a has a smaller number of gas injection openings (a smaller gas channel conductance) than the third shower head 208a, the pressure $[P_C]$ of the first PCV 300 becomes higher than the pressure $[P_E]$ of the second PCV 302. In a normal state, the gas pressure difference, i.e., $A=[P_C]-[P_E]$, falls within a predetermined span.

The maintenance processing unit 304 obtains the monitored pressures (pressure measurement values) $P_C$ and $P_E$ from the pressure sensors 300b and 302b and then calculates the gas pressure difference, i.e., $A=[P_C]-[P_E]$, at 100-millisecond intervals, to thereby monitor the pressures. The pressure monitoring is carried out for a predetermined time period $t_1$ after the start of the purging process until the pressure becomes stabilized, e.g., until the purging process is completed. To be specific, it is checked whether or not the gas pressure difference A falls within a preset tolerance range (lower limit $A_L$-upper limit $A_H$). Then, if it deviates from the tolerance range (lower limit $A_L$-upper limit $A_H$) for a specified time, e.g., for three seconds (thirty times of sampling consecutively performed at 100-millisecond intervals), it is determined as 'abnormality' and, then, an alarm is displayed. Herein, the 'abnormality' indicates that a relative balance between a gas distribution system of the PCV 300 or the first shower head 66a and that of the PCV 302 or the second shower head 68a is lost, which generally occurs when either one of the gas systems is broken.

As described above, when the alarm of 'abnormality' is displayed, a next semiconductor wafer W is prohibited from being loaded into the chamber 10 of the plasma etching apparatus by the interlock to perform a required maintenance work.

(Gas Pressure Stability Check)

'Gas pressure stability check' is carried out during a regular maintenance. In this examination as well, $N_2$ gas is supplied at a predetermined flow rate from an $N_2$ gas supply source (not shown) to the gas supply line 94 while keeping an exhaust rate of the inside of the chamber 10 constant. However, the $N_2$ gas is provided to not both of the gas distribution systems but only one of the gas distribution systems. That is, either one of the pressure control valves 300a and 302a of the PCVs 300 and 302 is tightly closed, whereas the other is fully opened.

To be more specific, an opening/closing state of the pressure control valves 300a and 302a is converted into two steps. In the first step, the pressure control valve 300a of the PCV 300 is tightly closed, whereas the pressure control valve 302a of the PCV 302 is fully opened. At this time, it is preferable to tightly close only the pressure control valve 300a after both of the pressure control valves 300a and 302a are fully opened first. On the contrary, in the second step, the pressure control valve 302a of the PCV 302 is tightly closed, whereas the pressure control valve 300a of the PCV 300 is fully opened. Further, in each step, monitored pressures (pressure measurement values) obtained from the pressure sensors 300b and 302b of the PCVs 300 and 302 are acquired.

Figure 14A:
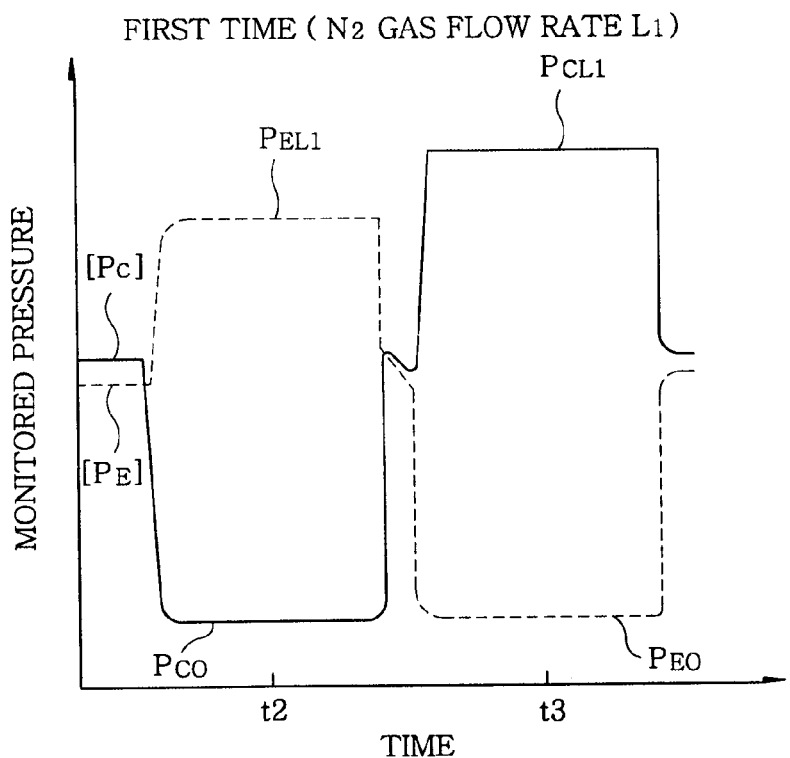
FIG. 14A is a wave form chart showing time characteristics of a monitored pressure (pressure measurement value) obtained from an examination of 'gas pressure stability check'.
Figure 14B:
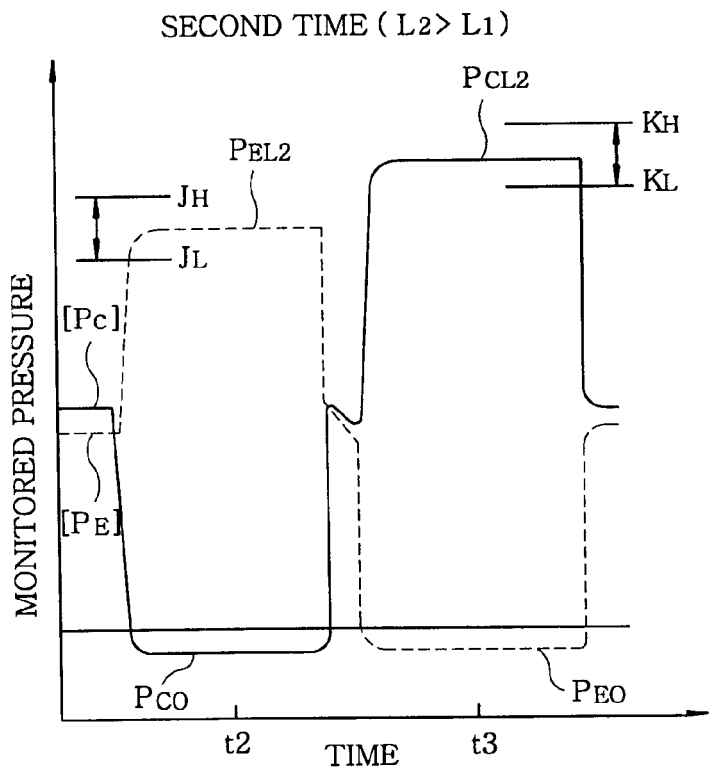
FIG. 14B illustrates another wave form chart depicting time characteristics of a monitored pressure (pressure measurement value) obtained from an examination of 'gas pressure stability check'.

FIGS. 14A and 14B provide waveforms of time characteristics of the monitored pressures (the pressure measurement values) obtained from the pressure sensors 300b and 302b while setting $N_2$ gas flow rates $L_1$ and $L_2$ respectively at 600 sccm and 1000 sccm, for example, in the examination of the 'gas pressure stability check'. As illustrated, in the first step, a considerably higher pressure $E_{EL}$ can be obtained from the fully opened PCV 302 than in an ordinary operation, whereas a considerably lower pressure $P_{CO}$ can be obtained from the fully closed PCV 300 than in the ordinary operation. Moreover, in the second step, a considerably higher pressure $P_{CL}$ can be obtained from the fully opened PCV 300 than in the ordinary operation, whereas a considerably lower pressure $P_{EO}$ can be obtained from the fully closed PCV 302 than in the ordinary operation.

In the first step, the maintenance processing unit 304 calculates an average of the monitored pressures $P_{EL}$ and $P_{CO}$, which are sampled at regular intervals (e.g., at one-second intervals) for a specified period (e.g., nine seconds) from a specific time $t_2$ when the gas pressure becomes stabilized. Thereafter, in the second step, the maintenance processing unit 304 calculates an average of the monitored pressures $P_{CL}$ and $P_{CO}$, which are sampled at regular intervals for a specified period from a specific time $t_3$ when the gas pressure becomes stabilized.

Next, the maintenance processing unit 304 performs a determination process for several examination items based on the monitored pressure data obtained from a plurality of, e.g., two examinations where the $N_2$ gas flow rate is set as a parameter.

Figure 15A:
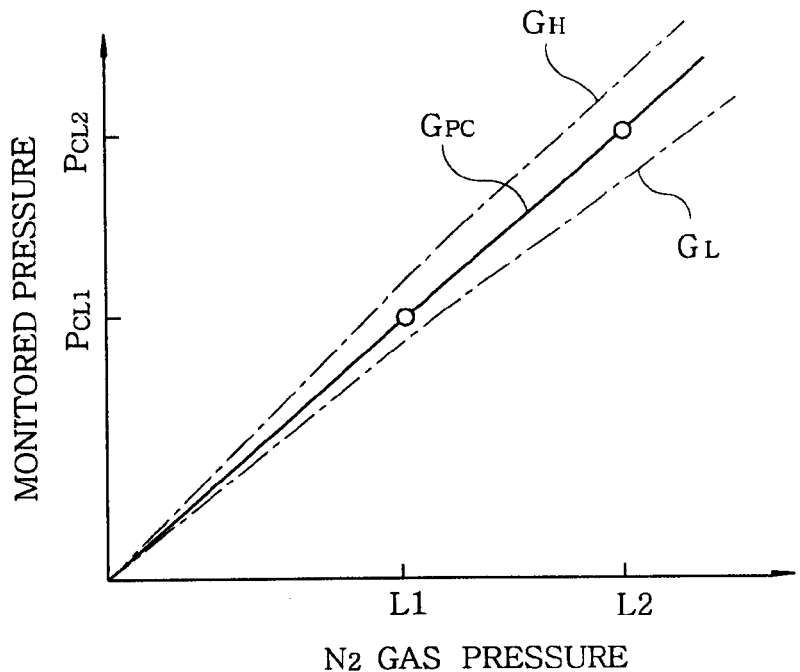
FIG. 15A provides span characteristics of a correlation between a gas flow rate and a pressure (responsiveness of the gas flow rate to the pressure)
Figure 15B:
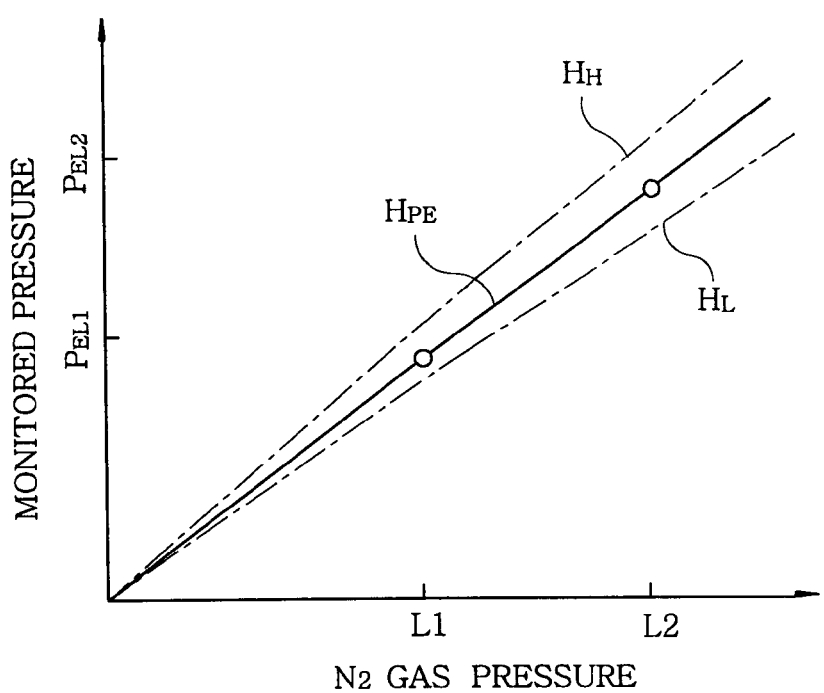
FIG. 15B depicts another span characteristics of a correlation between a gas flow rate and a pressure.

A first examination item is span characteristics of a responsiveness of a pressure to a gas flow rate. As shown in FIG. 15A, in the gas distribution system of the first PCV 300 or the first shower head 66a, an increasing rate or an inclination $G_{PC}$ between a pressure $P_{CL1}$ of a fully opened pressure valve obtained from a first ($N_2$ gas flow rate $L_1$) examination and a pressure $P_{CL2}$ of a fully opened pressure valve obtained from a second ($N_2$ gas flow rate $L_2$) examination is calculated by using a first order linear approximate equation $(P_{CL2}-P_{CL1})/(L_2-L_1)$. Further, it is checked whether the inclination $G_{PC}$ falls within a preset tolerance range (lower limit $G_L$-upper limit $G_H$). In the same manner, as illustrated in FIG. 15B, in the gas distribution system of the second PCV 302 or the third shower head 208a, an increasing rate or an inclination $H_{PE}$ between a pressure $P_{EL1}$ of a fully opened pressure valve obtained from the first ($N_2$ gas flow rate $L_1$) examination and a pressure $P_{EL2}$ of a fully opened pressure valve obtained from the second ($N_2$ gas flow rate $L_2$) examination is calculated by using a first order linear approximate equation $(P_{EL2}-P_{EL1})/(L_2-L_1)$. Furthermore, it is checked whether the inclination $G_{PC}$ falls within a preset tolerance range (lower limit $H_L$-upper limit $H_H$). As a cause of the deviation from the tolerance range, there may be considered a breakdown of a pressure control valve or a pressure sensor in the corresponding PCV or the like. Since the distribution control cannot be performed as it is planned, it is preferable to display an alarm instructing an inspection or a component replacement.

A second examination item is a CEL abrasion, i.e., an abrasion (deterioration) of the gas injection openings in the shower head. In the plasma etching apparatus, the shower head serving as an upper electrode is abraded and deteriorated by ion bombardments. Especially, an electric field is concentrated around the gas injection openings, resulting in an easy sputtering thereof. If the gas injection openings are abraded, the conductance thereof decreases, thereby lowering a pressure in the corresponding gas distribution system.

In order to determine an abrasion state (CEL abrasion in the center) of the gas injection openings in the first shower head 66a in the gas distribution system of the first PCV 300 or the first shower head 66a, it is checked whether or not the pressure $_{PCL2}$ of the fully opened pressure valve obtained under a predetermined $N_2$ gas flow rate (e.g., $L_2$) falls within a preset tolerance range (lower limit $K_L$-upper limit $K_H$), as illustrated in FIG. 14B. If it falls within the tolerance range (lower limit $K_L$-upper limit $K_H$), it is determined to be within a specification (normality). If otherwise, it is determined to be out of the specification (abnormality).

In the same manner, in order to determine an abrasion state (CEL abrasion in an edge) of the gas injection openings of the third shower head 208a in the gas distribution system of the first PCV 300 or the first shower head 66a, it is checked whether or not the pressure $P_{CE2}$ of the fully opened pressure valve obtained under a predetermined $N_2$ gas flow rate (e.g., $L_2$) falls within a preset tolerance range (lower limit $J_L$ to upper limit $J_H$), as illustrated in FIG. 14B. If it falls within the tolerance range (lower limit $J_L$-upper limit $J_H$), it is determined to be within a specification (normality). If otherwise, it is determined to be out of the specification (abnormality).

A third examination item is a gas leak in the gas distribution system. In the 'gas pressure stability check', as illustrated in FIGS. 14A and 14B, pressures $P_{CO}$ and $P_{EO}$ due to the gas leak can be detected even in the gas distribution system whose pressure control valves are tightly closed. Such gas leak includes a leak flowing back from the outside via the inside of the chamber 10 as well as a leak in the gas distribution system (especially, the annular partition members 64 and 264 in the shower heads). For example, in the first step, nitrogen gas distributed from the fully opened third shower head 208a into the chamber 10 flows into the gas distribution system through the gas injection openings of the first shower head 66a on the close side. A large amount of gas leak is not desirable.

Accordingly, as described above, it is checked whether or not the monitored pressures $P_{CO}$ and $P_{EO}$ obtained from the closed gas distribution system are higher than an allowable value M. If the monitored pressures $P_{CO}$ and $P_{EO}$ are lower than the allowable value M, it is determined to be normal, which indicates that the gas leak does not exceed the allowable amount. On the other hand, if the monitored pressures $P_{CO}$ and $P_{EO}$ are higher than the allowable value M, it is determined to be abnormal, which indicates that the gas leak exceeds the allowable amount.

Various reference values and tolerance ranges used in the aforementioned maintenance process can be changed at any time depending on a difference between apparatuses, a period of use, a processing gas or the like of the corresponding apparatus. Moreover, it is preferable to check a zero point of the pressure sensor of the pressure control unit by using a separate inspection unit.

Hereinafter, a cooling mechanism for the shower head also serving as an electrode in this embodiment will be described with reference to FIGS. 16 to 18. In a capacitively coupled plasma etching apparatus for generating a high-density plasma, it is very critical to control parallel plate electrodes at a specified temperature by reducing a temperature increase of the electrode, wherein the temperature thereof may be easily increased due to a radio frequency power applied to the electrodes.

Figure 16:
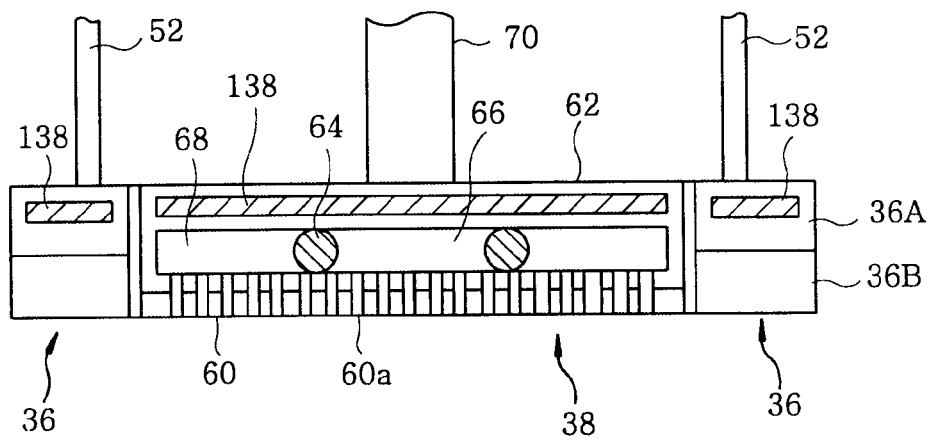
FIG. 16 describes a schematic sectional view illustrating locations of coolant passageways in an upper electrode of the plasma etching apparatus in accordance with the preferred embodiments.
Figure 17:
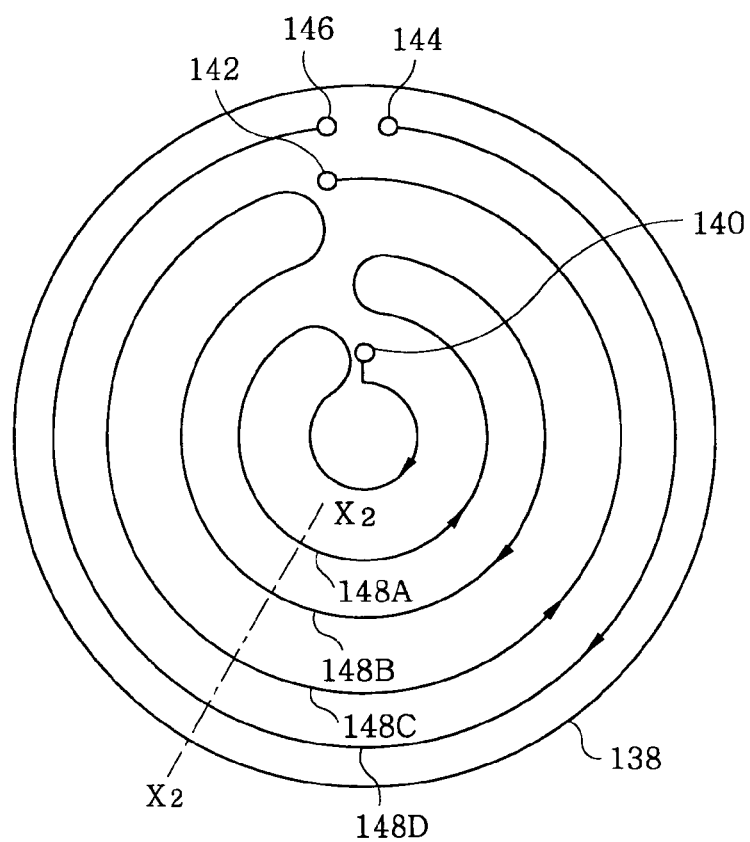
FIG. 17 is a top view showing coolant flow directions in the coolant passageways of the upper electrode.

FIG. 16 represents an installation position of a coolant passageway 138 provided in the upper electrode 34 (the outer upper electrode 36 and the inner upper electrode 38) in the plasma etching apparatus of this embodiment. FIG. 17 provides a pattern of a coolant path in the coolant passageway 138. FIG. 18 depicts a cross-sectional structure of the coolant passageway 138, which is taken along line $X_2$-$X_2$ of FIG. 17.

A coolant maintained at a specific temperature, e.g., a cooling water, is supplied and circulated from a chiller unit (not shown) provided at an outside into the coolant passageway 138 through a line. As shown in FIG. 17, the coolant supplied from the chiller unit via a line (not shown) flows through an inner entrance 140 into the coolant passageway 138. Next, the coolant goes around a central portion and then flows along a first coolant passageway 148a in an arrow direction. After the coolant goes around approximately concentrically along the first coolant passageway 148a, it flows along a second coolant passageway 148b in a direction opposite to that of the flow in the first coolant passageway 148a. Then, the coolant flows along a third coolant passageway 148c in a direction opposite to that of the flow in the second coolant passageway 148b and then goes through an inner outlet 142. Herein, the inner outlet 142 and an outer entrance 144 are connected to each other by a line (not illustrated), and the coolant flowing from the inner outlet 142 to the outer entrance 144 flows along a fourth coolant passageway 148d in a direction opposite to that of the flow in the third coolant passageway 148c. Since the directions of the coolant flows in the adjacent coolant passageways are opposite to each other, a temperature nonuniformity in the outer and the inner upper electrode 36 and 38 can be considerably reduced.

Figure 18A:
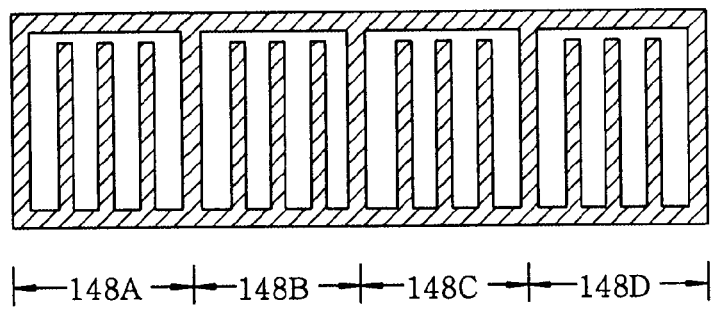
FIGS. 18A and 18B provide cross-sectional views illustrating cross sectional shapes of the coolant passageways of the upper electrode.
Figure 18B:
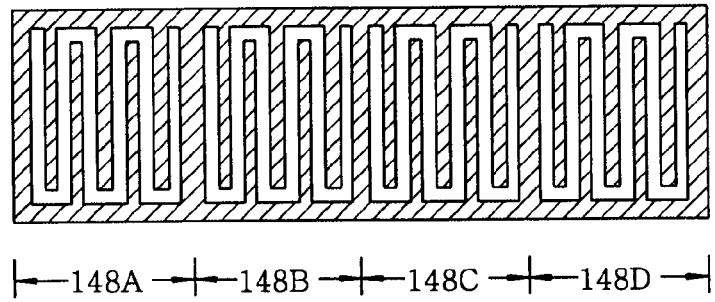

FIGS. 18A and 18B show two favorable cross-sectional shapes of the coolant passageway 148. In other words, FIG. 18A provides a comb-shaped cross section of the coolant passageway, and FIG. 18B describes a serpentine cross section of the coolant passageway. With such comb-shaped or serpentine cross sectional structure of the passageway, an area of a sidewall of the coolant passageway increases. Accordingly, a contact area between the coolant and the coolant passageway increases, thereby improving a heat absorption efficiency of the coolant. Further, in any of the cases, the cross sectional area of the coolant passageway 138 has a similar size to that of the aforementioned outer line. Since the coolant passageway has such large cross sectional area, it is possible to suppress a pressure loss and prevent a flow velocity of the coolant from being deteriorated. In fact, whereas a conventional temperature difference between the coolant and the outer and the inner upper electrode 36 and 38 is 20° C., in this embodiment, the temperature difference is reduced to 2° C.

With such cooling unit for the shower head also serving as the electrode, it is possible to perform a highly precise temperature control of the upper electrode which generates a high-density plasma by a radio frequency power applied thereto. Thus, an adhesion of reaction products onto the electrode 60 shown in FIG. 16 is reduced, thereby considerably reducing the clogging of the gas injection openings 60a. As a result, the maintenance of the plasma etching apparatus becomes simple.

The following is a description on a gas line for introducing a processing gas into the central gas introduction chamber 66 or the peripheral gas introduction chamber 68 of the shower head also serving as the electrode. In this embodiment, all of the gas supply lines including the gas supply line 90, the branch line 94a and the like in the chamber 10 are made of an insulating material. This is because if the gas supply line is formed of a conductive material such as SUS, a radio frequency transmission in the chamber becomes disturbed, thereby significantly affecting the etching characteristics.

Figure 19:
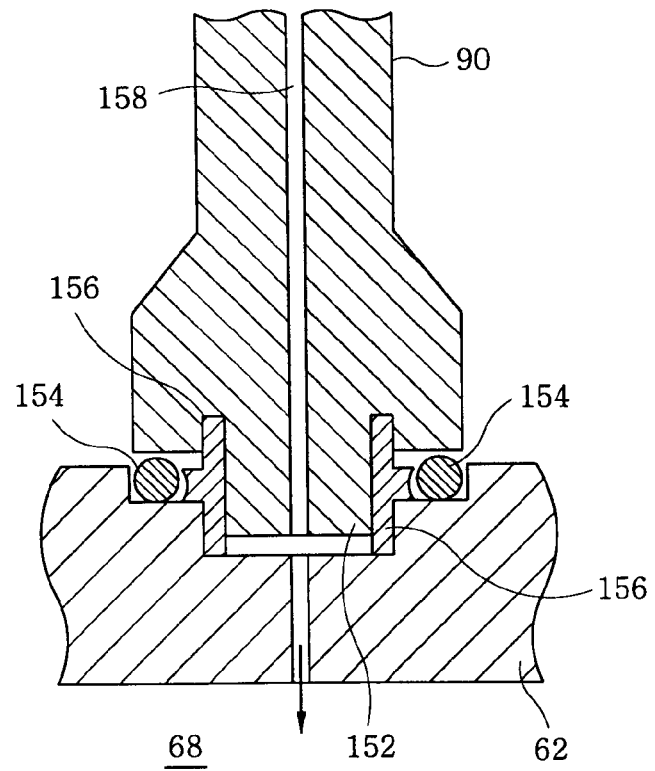
FIG. 19 presents a fragmentary sectional view showing a composition of a joint portion of a processing gas introduction line connected to an upper shower head.

FIG. 19 illustrates an enlarged view of an area 150 of FIG. 1. As shown in FIG. 19, a leading end portion of the gas supply line 90, which is made of Teflon (registered mark), is provided with a protruded portion 152, and a top surface of the electrode support 62 is provided with a recess portion corresponding to the protruded portion 152. Since the protruded portion 152 is fitted in the recess portion without forming any substantial space or gap therebetween, the gas supply line 90 is airtightly attached to the electrode support 62 via an O-ring 154 and a center ring 156. Herein, the processing gas is supplied into the peripheral gas introduction chamber 68 through a gas channel 158 of the gas supply line. Likewise, if a joint portion of the gas supply line 90 connected to the shower head of the upper electrode 34 is blocked by an insulating material such as Teflon (registered trade mark) without forming a gap, it is possible to actually prevent an abnormal discharge in a processing gas introduction line.

Hereinafter, a safety function of the plasma etching apparatus of this embodiment, especially, an electromagnetic wave leakage preventing function, i.e., an electro-magnetic interference (EMI) shielding function, will be described with reference to FIGS. 1 and 20 to 22.

Figure 20A:
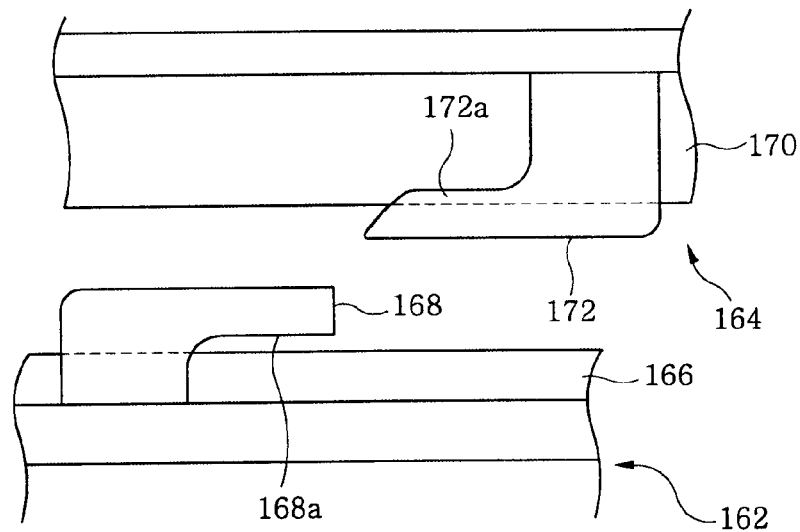
FIG. 20A is a fragmentary enlarged side view (separated state) of principal parts of a chamber separating/coupling portion in a plasma etching apparatus in accordance with a preferred embodiment.
Figure 20B:
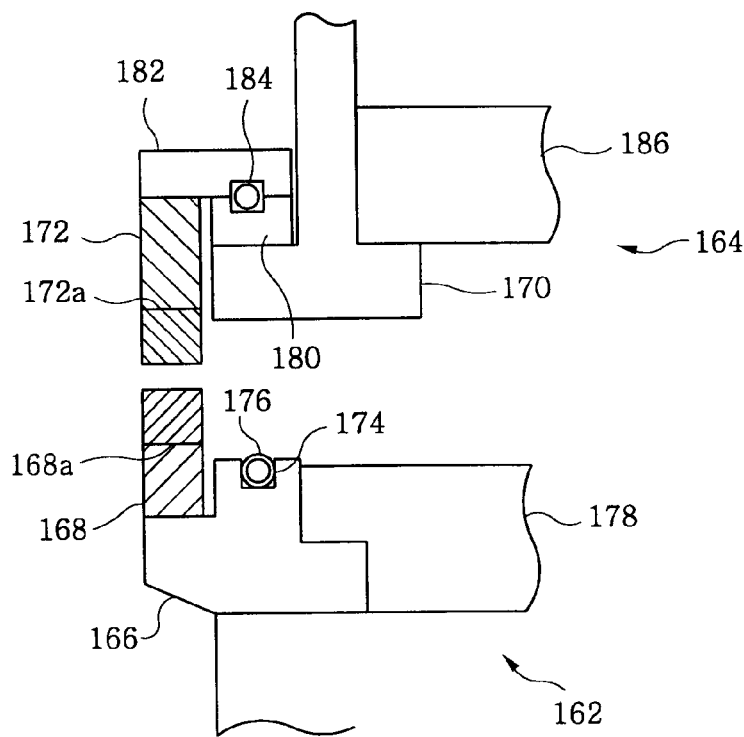
FIG. 20B offers a fragmentary enlarged sectional view (separated state) of the principal parts in FIG. 20A.

As described in FIGS. 20A and 20B, the chamber 10 is divided into a lower chamber assembly 162 and an upper chamber assembly 164 by line $X_1$-$X_1$ depicted in FIG. 1. FIG. 20A is a side view of principal parts, showing opposite portions of the separated assemblies 162 and 164, and FIG. 20B provides a cross-sectional view thereof.

As depicted in FIG. 20A, a lower claw 168 is fixedly attached to a predetermined specific location of a cylindrical joint member 166 of the lower chamber assembly 162, and an upper claw 172 is provide at a predetermined specific location of a cylindrical joint member 170 of the upper chamber assembly 164. Herein, the upper claw 172 is circumferentially movable within a predetermined range with the help of a bearing mechanism to be described later. Further, a plurality pairs of the upper and the lower claws 172 and 168 facing each other are disposed at regular intervals along a circumference of the chamber.

As illustrated in FIG. 20B, a shield groove 174 is formed in a top surface of the cylindrical lower joint member 166 such that it extends along the top surface portion, and an annular EMI shield spiral 176 is inserted in the shield groove 174. Further, an insulating member 178 is provided adjacently to an inner side of the lower joint member 166 along its radial direction. In the meantime, a bearing support 180 is fixed on an outer wall of the cylindrical upper joint member 170, and a bearing drive 182 is mounted on the bearing support 180 via the bearing mechanism 184 such that it can move in a circumferential direction. Moreover, the insulating member 186 is provided adjacently to an inner side of the upper joint member 170 along its radial direction. The upper and the lower insulating member 186 and 178 form the insulating shielding member 44 shown in FIG. 1.

Figure 21A:
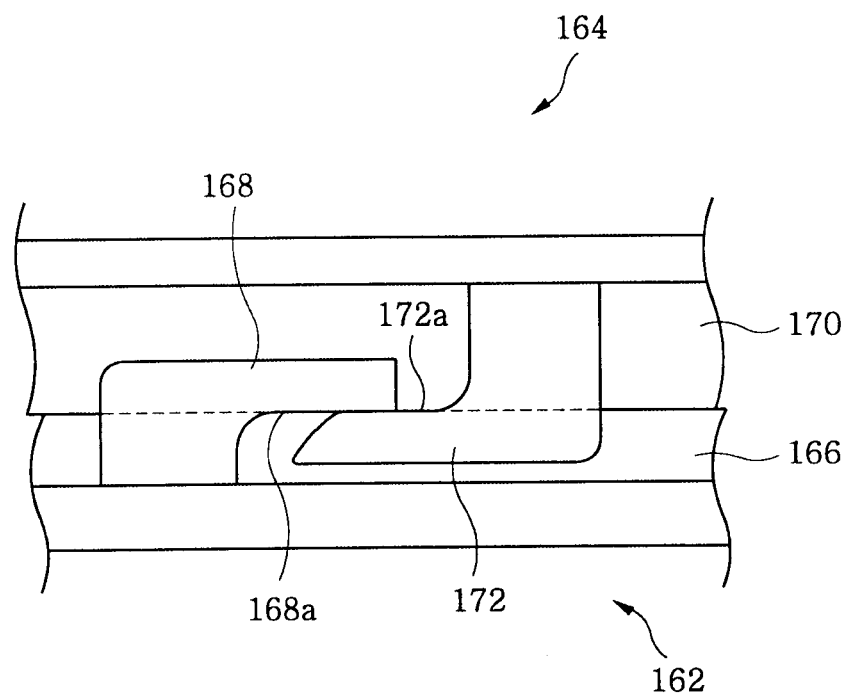
FIG. 21A provides a fragmentary enlarged side view (coupled state) of the principal parts of the chamber separating/coupling portion in the plasma etching apparatus in accordance with a preferred embodiment.
Figure 21B:
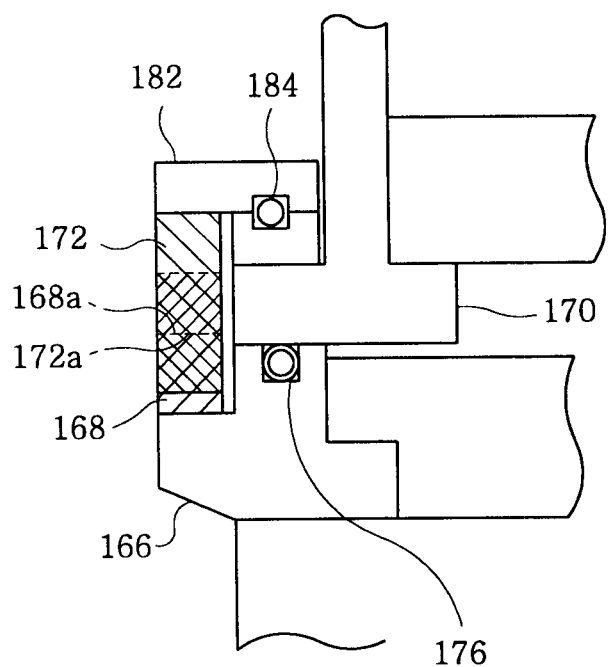
FIG. 21B offers a fragmentary enlarged sectional view (coupled state) of the principal parts in FIG. 21A.
Figure 22:
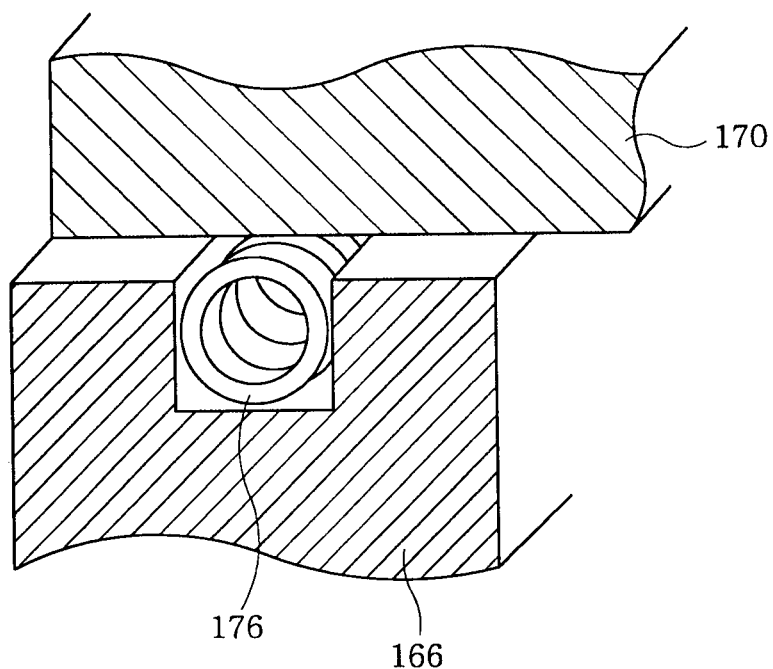
FIG. 22 depicts an overall perspective view illustrating an attachment state and a structure of an EMI shield spiral in a preferred embodiment.

FIGS. 21A and 21B present a state where the lower chamber assembly 162 and the upper chamber assembly 164 are coupled to each other along the line $X_1$-$X_1$ shown in FIG. 1. FIG. 21A is a side view of principal parts of the coupled chamber joint portion, and FIG. 20B provides a cross-sectional view thereof.

As depicted in FIG. 21A, the upper claw 172 of the upper chamber assembly 164 is engaged with the lower claw 168 of the lower chamber assembly 162 wherein a top surface 172a is in contact with a bottom surface 168a. After the top surface of the lower joint portion 166 makes a contact with the bottom surface of the upper joint portion 170, the bearing mechanism 184 moves or displaces the upper claw 172 by a predetermined distance in a circumferential direction with the help of a driving and movement converting mechanism (not shown) such as a pinion and rack, thereby achieving the engagement between the upper and the lower claw 172 and 168.

In the coupled state of this embodiment, as shown in FIG. 21B, the lower joint member 166 is electrically connected to the upper joint member 170 by the EMI shield spiral 176, thereby preventing a radio frequency inputted in this apparatus from being leaked out of the chamber 10. Moreover, the lower and the upper joint member 166 and 170 make an airtight contact via a well-known airtight sealing member (not shown) such as an O-ring. Furthermore, the airtight sealing member such as the O-ring may be provided on the inner side of the EMI shield spiral 176.

A mechanism for preventing an electromagnetic wave leakage or a noise generation is provided at desired places in addition to the above-described place in the plasma etching apparatus of this embodiment. At all places, as can be seen from the enlarged view of the FIG. 22, the EMI shield spiral 176 made of, e.g., stainless steel, is inserted in a spiral attachment groove provided in a top surface of a cylindrical lower joint member (e.g., the lower joint member 166) and, further, an upper joint member (e.g., the upper joint member 170) is detachably connected thereto from above such that it pushes the EMI shield spiral 176 thereabove.

Figure 23:
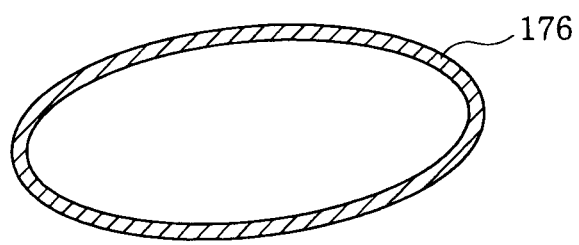
FIG. 23 represents a perspective view describing a structure of the EMI shield spiral in the preferred embodiment.

In this embodiment, as shown in FIG. 23, the EMI shield spiral 176 is formed as a ring body having a required diameter or length, and the ring-shaped EMI shield spiral 76 is inserted into the spiral groove. With such ring-shaped EMI shield spiral, the stability and safety in an assembly or a maintenance of the plasma etching apparatus can be considerably enhanced. Conventionally, the EMI shield spiral is cut into a required length, and the linear EMI shield spiral is inserted into the spiral attachment groove. However, in case of the linear EMI shield spiral, if both ends thereof are not perfectly met to each other in the inserted state, the electromagnetic wave leakage preventing function becomes poor or the insertion operation becomes difficult. Further, the linear EMI shield spiral can be formed as the ring-shaped EMI shield spiral by welding both ends thereof to be connected.

Although the preferred embodiments of the present invention have been described, the present invention is not limited to those preferred embodiments. It will be understood by those skilled in the art that various changes and modifications may be made without departing from the spirit and scope of the invention.

For example, in the first embodiment, there is provided the triple shower head system including the upper central shower head 66a, the upper peripheral shower head 68a and the side shower head 108, wherein the upper central shower head 66a and the upper peripheral shower head 68a form the upper shower head provided at the upper electrode 34 (the inner upper electrode 38), and the side shower head 108 is provided on the sidewall of the chamber 10. However, it is possible to provide a dual shower head system including the upper shower head (66a and 68a) and the side shower head 108, wherein the upper shower head is a single system obtained by omitting the annular partition member 64, for example. In such case, it is preferable to introduce an etchant gas through the upper shower head (66a and 68a) and a dilution gas through the side shower head 108. Further, in the side gas inlet, a processing gas can be introduced through a gas pipe instead of the shower head 108 of this embodiment.

In the first preferred embodiment, an additive gas such as $O_2$ gas or CO gas is introduced together with a dilution gas (especially, an inert gas such as Ar) through the side shower head 108 or the upper central shower head 66a into the chamber 10. However, the additive gas may be introduced together with an etchant gas through the upper central shower head 66a into the chamber 10. Further, the additive gas may be introduced into the chamber 10 after being distributed based on the classification by gas species or at a desired flow rate ratio between the shower heads 108 and 66a for the dilution gas and the shower head 68a for the etchant or between the shower heads 108 and 68a for the dilution gas. Furthermore, it is also possible to add a predetermined amount of etchant gas to the gas introduced through the shower heads 108 and 66a for the dilution gas or a predetermined amount of dilution gas (especially, an inert gas) to the gas introduced through the shower head 68a of the etchant.

In the second preferred embodiment, an additive gas such as O₂ gas or CO gas is introduced together with a dilution gas (especially, an inert gas such as Ar) through the third shower head 208a or the first upper shower head 66a into the chamber 10. However, the additive gas may be introduced together with an etchant gas through the second upper shower head 68a into the chamber 10. Further, the additive gas may be introduced into the chamber 10 after being distributed based on the classification by gas species or at a desired flow rate ratio between the shower heads 208a and 66a for the dilution gas and the shower head 68a for the etchant or between the shower heads 208a and 68a for the dilution gas. Furthermore, it is also possible to add a predetermined amount of etchant gas to the gas introduced through the shower heads 208a and 66a for the dilution gas or a predetermined amount of dilution gas (especially, an inert gas) to the gas introduced through the shower head 68a for the etchant.

Although, in the aforementioned embodiment, there has been described a case where gases are distributed to two gas supply lines for a flow rate ratio control, the gases may be distributed to three or more gas supply lines. For example, in case a mass flow control unit is included as the pressure control unit described in FIG. 12, the gas supply lines may be branched by providing in parallel three or more PCVs corresponding to the number of the gas supply lines. Further, when the maintenance check of the flow rate ratio control unit is performed by using three or more PCVs, two PCVs are selected and, then, the check and the determination described above with reference to FIGS. 13 to 15 can be carried out. At this time, it is preferable to check and determine for every combination of two PCVs. Moreover, a method and an apparatus for performing a maintenance of the PCVs of the aforementioned embodiment may also be applied to any processing apparatuses other than the plasma etching apparatus.

The plasma etching apparatus of the present invention may arbitrarily employ an etchant gas, a dilution gas and an additive gas depending on processes. For instance, an organic compound gas containing halogen may contain chlorine Cl, bromine Br or iodine I without being limited to fluorine F.

Although the single annular outer upper electrode 36 forming the upper electrode 34 is provided in the aforementioned embodiment, two or more outer upper electrodes 36 spaced from each other at regular intervals may be provided around a peripheral portion of the inner upper electrode 38. The upper electrode 34 may be formed in either one part or separate parts.

Further, although a substrate to be processed is a semiconductor wafer in the aforementioned embodiment, the substrate to be plasma-processed may also be a glass substrate for use in a flat display panel such as an LCD glass substrate and a PDP substrate.

Although the plasma etching apparatus has been described in the aforementioned embodiment, the present invention may be applied to a plasma CVD apparatus for forming an insulating film, a conductive film, a semiconductor film or the like and an apparatus for plasma cleaning of an insulating substrate surface, a chamber inner wall or the like.

While the invention has been shown and described with respect to the preferred embodiments, it will be understood by those skilled in the art that various changes and modification may be made without departing from the spirit and scope of the invention as defined in the following claims.

What is claimed is:

1. A plasma etching method performed in a plasma etching apparatus having a depressurizable processing chamber, a lower electrode for mounting thereon a substrate to be processed in the processing chamber, an upper electrode facing the lower electrode in the processing chamber with a plasma generation region formed therebetween, a radio frequency power supply unit for applying a radio frequency power between the upper electrode and the lower electrode to thereby form a radio frequency electric field in the plasma generation region, the method comprising:

supplying a second gas to a first gas inlet to introduce the second gas through a first region containing a central portion of the upper electrode into the plasma generation region;

feeding a first gas to a second gas inlet to introduce the first gas through a second region of the upper electrode provided at an outside of the first region along its radial direction into the plasma generation region; and supplying the second gas to a third gas inlet to introduce the second gas through a third region of the upper electrode provided at an outside of the second region along its radial direction into the plasma generation region, wherein the first gas consists of an etchant gas and the second gas consists of a dilution gas, wherein the second gas is introduced through the first gas inlet and the third gas inlet so that the first gas introduced through the second gas inlet is maintained between a central portion and a peripheral portion of the plasma generation region, and wherein the dilution gas is at least one species of gas selected from the group consisting of Ar, CO, and O₂.

2. The plasma etching method of claim 1, wherein the first gas inlet has a first gas injection portion provided in the first region of the upper electrode, and the second gas is injected through the first gas injection portion toward the plasma generation region, and wherein the first gas inlet has a first gas supply line for supplying the second gas toward the first gas injection portion and a first gas buffer space for accumulating the second gas supplied through the first gas supply line in front of the first gas injection portion.

3. The plasma etching method of claim 1, wherein the second gas inlet has a second gas injection portion provided in the second region of the upper electrode, and the first gas is injected through the second gas injection portion toward the plasma generation region, and wherein the second gas inlet has a second gas supply line for supplying the first gas toward the second gas injection portion and a second gas buffer space for accumulating the first gas supplied through the second gas supply line in front of the second gas injection portion.

4. The plasma etching method of claim 1, wherein the third gas inlet has a third gas injection portion provided in the third region of the upper electrode, and the second gas is injected through the third gas injection portion toward the plasma generation region.

5. The plasma etching method of claim 4, wherein the third gas injection portion is made of a material selected from a group consisting of Si, SiC and quartz.

6. The plasma etching method of claim 4, wherein the third gas inlet has a third gas supply line for supplying the second gas toward the third gas injection portion and a third gas buffer space for accumulating the second gas supplied through the third gas supply line in front of the third gas injection portion.

7. The plasma etching method of claim 1, further comprising a flow rate ratio control unit for controlling a flow rate ratio of the second gas depending on processes.

8. The plasma etching method of claim 1, wherein the etchant gas is selected from the group consisting of CxFy, CxHyFz, and a combination thereof.

9. The plasma etching method of claim 1, wherein a first coolant passageway and a second coolant passageway are provided in the upper electrode, the first and the second coolant passageway being concentrically arranged, and
    wherein after a coolant flows along the first coolant passageway, the coolant flows along the second coolant passageway in a flowing direction opposite to that in the first coolant passageway.

10. The method according to claim 1, wherein a ratio of a flow rate of the second gas supplied to the first gas inlet to a flow rate of the second gas supplied to the third gas inlet is controlled so that etching of a surface of the substrate becomes uniform.

11. The method according to claim 10, wherein the flow rate of the second gas supplied to the first gas inlet is greater than the flow rate of the second gas supplied to the third gas inlet.

* * * * *